United States Patent
Nagasaka et al.

(10) Patent No.: US 12,275,643 B2
(45) Date of Patent: Apr. 15, 2025

(54) METHOD FOR PRODUCING TETRAHYDROBORIC ACID SALT, DEVICE FOR PRODUCING TETRAHYDROBORIC ACID SALT, AND TETRAHYDROBORIC ACID SALT

(71) Applicant: SINTOKOGIO, LTD., Nagoya (JP)

(72) Inventors: Masahiko Nagasaka, Toyokawa (JP); Tomoji Ishida, Toyokawa (JP)

(73) Assignee: SINTOKOGIO, LTD., Nagoya (JP)

( * ) Notice: Subject to any disclaimer, the term of this patent is extended or adjusted under 35 U.S.C. 154(b) by 1081 days.

(21) Appl. No.: 17/271,367

(22) PCT Filed: Feb. 8, 2019

(86) PCT No.: PCT/JP2019/004717
§ 371 (c)(1),
(2) Date: Feb. 25, 2021

(87) PCT Pub. No.: WO2020/044596
PCT Pub. Date: Mar. 5, 2020

(65) Prior Publication Data
US 2021/0323820 A1    Oct. 21, 2021

(30) Foreign Application Priority Data
Aug. 27, 2018  (JP) .................. 2018-158478

(51) Int. Cl.
*C01B 6/21*  (2006.01)
*H01J 37/32* (2006.01)
*H05H 1/24*  (2006.01)

(52) U.S. Cl.
CPC ............. *C01B 6/21* (2013.01); *H01J 37/32* (2013.01); *H05H 1/2431* (2021.05)

(58) Field of Classification Search
CPC .......... C01B 6/21; H05H 1/2431; H01J 37/32
See application file for complete search history.

(56) References Cited

U.S. PATENT DOCUMENTS

| | | | |
|---|---|---|---|
| 2005/0087435 A1 | 4/2005 | Kong et al. | |
| 2006/0078486 A1* | 4/2006 | Chin ............ | C22B 26/10 |
| | | | 423/288 |
| 2006/0103318 A1 | 5/2006 | Kong | |
| 2006/0106195 A1 | 5/2006 | Kong | |
| 2011/0280797 A1* | 11/2011 | Mohtadi ........... | C01B 3/065 |
| | | | 423/648.1 |

(Continued)

FOREIGN PATENT DOCUMENTS

| | | |
|---|---|---|
| CN | 1803816 A | 7/2006 |
| CN | 102910586 A | 2/2013 |

(Continued)

OTHER PUBLICATIONS

International Preliminary Report on Patentability mailed Mar. 11, 2021 for PCT/JP2019/004717.

(Continued)

*Primary Examiner* — James A Fiorito
(74) *Attorney, Agent, or Firm* — Faegre Drinker Biddle & Reath LLP

(57) ABSTRACT

A method for producing a tetrahydroborate includes a hydrogenating step (step S14) of exposing a borate to a hydrogen plasma while grinding the borate.

16 Claims, 15 Drawing Sheets

(56) References Cited

U.S. PATENT DOCUMENTS

2017/0183236 A1     6/2017    Yoshizaki

FOREIGN PATENT DOCUMENTS

| | | |
|---|---|---|
| CN | 103482571 A | 1/2014 |
| CN | 107344713 A | 11/2017 |
| EP | 1 787 952 A1 | 5/2007 |
| JP | H08-067503 A | 3/1996 |
| JP | 2002-110398 A | 4/2002 |
| JP | 2004-103423 A | 4/2004 |
| JP | 2004-224684 A | 8/2004 |
| JP | 2006-104055 A | 4/2006 |
| JP | 2006-143537 A | 6/2006 |
| JP | 2011-032131 A | 2/2011 |
| JP | 2011-148644 A | 8/2011 |
| WO | WO-2015/190004 A1 | 12/2015 |
| WO | WO-2015/190403 A1 | 12/2015 |

OTHER PUBLICATIONS

Lingling Li, "Preparation and modification of negative electrode materials for nickel metal hydride battery by ball milling assisted by dielectric barrier discharge plasma," South China University of Technology, 2013.

A.M.Aksenczuk et al., "Plasma assisted absorption and reversible desorption of hydrogen gas in zirconium powder using electric discharge assisted mechanical milling method," Journal of Alloys and Compounds, Apr. 26, 2016, p. 434-p. 443.

\* cited by examiner

METHOD FOR PRODUCING TETRAHYDROBORIC ACID SALT, DEVICE FOR PRODUCING TETRAHYDROBORIC ACID SALT, AND TETRAHYDROBORIC ACID SALT

TECHNICAL FIELD

The present disclosure relates to a method for producing a tetrahydroborate, a device for producing a tetrahydroborate, and tetrahydroborate.

BACKGROUND ART

Patent Literatures 1 and 2 each disclose a method for producing a tetrahydroborate by hydrogenating a borate. According to the method disclosed in Patent Literature 1, sodium metaborate powder is reacted with magnesium powder for approximately two hours at approximately 550° C. under a hydrogen atmosphere of 2.3 MPa. According to the method disclosed in Patent Literature 2, sodium metaborate powder is reacted with granular aluminum for approximately one hour at approximately 300° C. under a hydrogen atmosphere of 1 MPa while the granular aluminum is roll-ground.

CITATION LIST

Patent Literature

Patent Literature 1: Japanese Unexamined Patent Publication No. 2004-224684
Patent Literature 2: International Publication No. WO 2015/190403

SUMMARY OF INVENTION

Technical Problem

The method disclosed in each of Patent Literatures 1 and 2 requires maintaining the atmosphere in a large-capacity reaction container at a high temperature and a high pressure for one hour or more, making it necessary to keep on externally injecting a large amount of energy. Further, the method disclosed in each of Patent Literatures 1 and 2, which consumes magnesium or aluminum as a reducing metal as a consumable material, includes a considerably high-cost process. Moreover, the method disclosed in each of Patent Literatures 1 and 2 requires one hour or more as a processing time for one batch with less productivity. As such, in the field of producing tetrahydroborates, a producing method sufficient in terms of industrial application has not currently been established.

The present disclosure, which has been made in view of the above circumstances, provides a new method for producing a tetrahydroborate. The present disclosure also provides a producing device used for the producing method and a tetrahydroborate obtained by the producing method.

Solution to Problem

An aspect of the present disclosure is a method for producing a tetrahydroborate, the method comprising a hydrogenating step of exposing a borate to a hydrogen plasma while grinding the borate.

In one embodiment, the hydrogen plasma may be generated by using a source gas containing at least one of a hydrogen gas and a hydrocarbon gas.

In one embodiment, the hydrogen plasma may be a plasma obtained by dielectric-barrier discharge. In one embodiment, the hydrogen plasma may be provided to the borate as a plasma jet. In one embodiment, the hydrogen plasma may be a high-temperature plasma.

In one embodiment, the borate may be exposed to the hydrogen plasma while being heated and ground in the hydrogenating step.

In one embodiment, a reductant bondable to hydrogen may be simultaneously processed with the borate in the hydrogenating step.

In one embodiment, the borate may be sodium metaborate.

In one embodiment, the producing method may further comprise, prior to the hydrogenating step, a preheating step of heating the borate.

In one embodiment, the producing method may further comprise, prior to the hydrogenating step, a borate preparing step of reacting tetrahydroborate with water to obtain the borate.

In one embodiment, the producing method may further comprise, prior to the preheating step, a borate preparing step of reacting tetrahydroborate with water to obtain the borate.

Another aspect of the present disclosure is a device for producing a tetrahydroborate. The device comprises: a ball mill container including therein a processing chamber for grinding media and a borate to be contained; a drive causing the ball mill container to rotate; a gas supplying unit supplying a source gas to the processing chamber; a power source applying a voltage; and a plasma generator including a dielectric member constituting at least a portion of an inner wall surface of the processing chamber, at least a pair of electrodes coupled to the dielectric member and to which the voltage from the power source is applied, and an insulating body insulating at least the pair of electrodes from each other, in which the drive causes the ball mill container to rotate, thereby grinding the borate, the gas supplying unit makes an atmosphere of the source gas in the processing chamber, and the plasma generator generates a hydrogen plasma on a surface of the dielectric member by virtue of dielectric-barrier discharge based on the voltage applied from the power source in the processing chamber within the atmosphere of the source gas, causing the borate to be exposed to the hydrogen plasma during a rotation of the ball mill container.

Another aspect of the present disclosure is a device for producing a tetrahydroborate. The device comprises a ball mill container including therein a processing chamber for grinding media and a borate to be contained; a drive causing the ball mill container to rotate; a plasma generator configured to generate, when a voltage is applied thereto, a plasma jet of a hydrogen plasma, the plasma generator including a plasma jet nozzle fixedly disposed in the processing chamber in such a way as to eject the plasma jet to an accumulated spot of the grinding media and the borate contained in the processing chamber; a power source applying the voltage to the plasma generator; and a gas supplying unit supplying a source gas to the plasma generator, in which the drive causes the ball mill container to rotate, thereby grinding the borate, and the plasma jet nozzle generates the plasma jet based on the voltage applied from the power source and the source gas supplied from the gas supplying unit and ejects the plasma jet through the plasma jet nozzle to the accumulated spot of the grinding media and the borate during a rotation of the ball mill container.

Another aspect of the present disclosure is a device for producing a tetrahydroborate. The device comprises a ball mill container including therein a processing chamber for grinding media with electrical conductivity and a borate to be contained; a drive causing the ball mill container to rotate; a gas supplying unit supplying a source gas to the processing chamber; a plasma generator including at least a pair of electrodes constituting at least a portion of an inner wall surface of the processing chamber or at least a portion of a lifter member provided in the processing chamber, and an insulating body insulating at least the pair of electrodes from each other; and a power source applying a voltage to between at least the pair of electrodes, in which the drive causes the ball mill container to rotate, thereby grinding the borate and changing an energization state between at least the pair of electrodes via the grinding media caused to flow, the gas supplying unit makes an atmosphere of the source gas in the processing chamber, and with the voltage applied from the power source in the processing chamber within the atmosphere of the source gas, the plasma generator generates a hydrogen plasma in a form of a spark on surfaces of the grinding media during a rotation of the ball mill container, causing the borate to be exposed to the hydrogen plasma.

Another aspect of the present disclosure is a tetrahydroborate having a composition represented by the following formula (A) or (B).

$$M_x B_y H_z \quad (A)$$

$$N_s B_t H_u \quad (B)$$

In the formula (A), M is at least one selected from the group consisting of Li, Na, and K, x is 0.05 or more and less than 1.0, y is 0.6 or more and less than 1.0, and z is 4.0. In the formula (B), N is at least one selected from the group consisting of Ca and Mg, s is 0.05 or more and less than 1.0, t is 1.2 or more and less than 2.0, and u is 8.0.

Advantageous Effects of Invention

The various aspects and embodiments of the present disclosure can provide a new method for producing a tetrahydroborate. The various aspects and embodiments of the present disclosure can provide a device for producing a tetrahydroborate. The various aspects and embodiments of the present disclosure can provide a tetrahydroborate obtained by the producing method.

DESCRIPTION OF EMBODIMENTS

Figure 1:
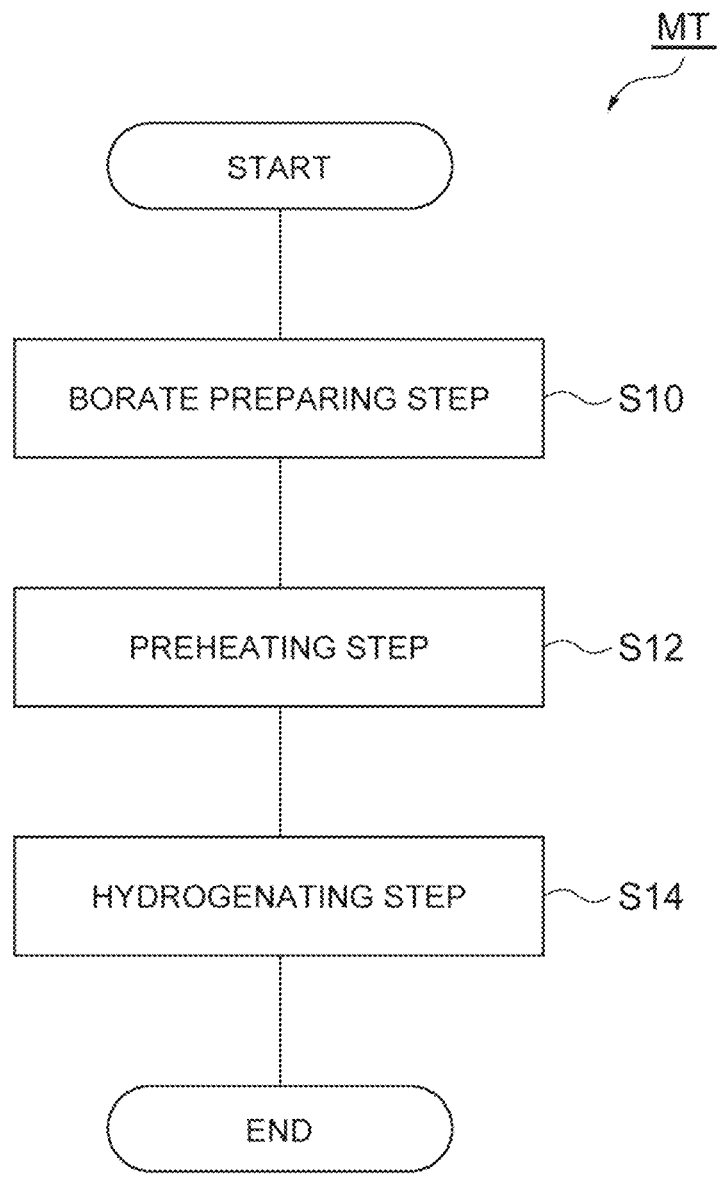
FIG. 1 is a flowchart showing one example of a method for producing a tetrahydroborate.

A detailed description is made below on an embodiment of the present disclosure, while referring to the drawings, if the case may be. It is to be noted that the present disclosure is not limited to the following embodiment. The X-direction and Y-direction in the drawings are horizontal directions and the Z-direction is a vertical direction.

<Method for Producing Tetrahydroborate>

FIG. 1 is a flowchart showing one example of a method for producing a tetrahydroborate. A method MT shown in FIG. 1 is a method for producing a tetrahydroborate from a borate. The method MT includes a borate adjusting step (step S10), a preheating step (step S12), and a hydrogenating step (step S14).

In the method MT, the borate adjusting step (step S10) and the preheating step (step S12) are not necessarily performed but performed, if necessary. Accordingly, the hydrogenating step (step S14) is first described and, subsequently, the borate adjusting step (step S10) and the preheating step (step S12) are described.

(Hydrogenating Step: Step S14)

The hydrogenating step is a step of exposing the borate to a hydrogen plasma while grinding it. Examples of the borate include a metaborate, a tetraborate, or a pentaborate. Examples of the metaborate include $NaBO_2$, $KBO_2$, $LiBO_2$, $Ca(BO_2)_2$, or $Mg(BO_2)_2$. Examples of the tetraborate include $Na_2B_4O_7$, $Na_2O \cdot 2B_2O_3$, $K_2O \cdot B_2O_3$, $Li_2B_4O_7$, or $Mg_3B_4O_9$. Examples of the pentaborate include $NaB_5O_8$, $Na_2O \cdot 5B_2O_3$, $KB_5O_8$, $K_2O \cdot 5B_2O_9$, or $LiB_5O_8$. The examples of the borate may include natural borate minerals, namely, $Na_2B_4O_7 \cdot 10H_2O$, $Na_2B_4O_7 \cdot 4H_2O$, $Ca_2B_6O_{11} \cdot 5H_2O$, $CaNaB_5O_9 \cdot 6H_2O$, or $Mg_7Cl_2B_{17}O_{30}$. Among the examples listed above as the borate, sodium metaborate ($NaBO_2$) may be selected as the borate in terms of availability, acquisition cost, chemical stability, hydrogen desorbability, hydrogen storage density, and the like.

The borate, which is solid, is not particularly limited in shape. The borate may be in powder form. The mean particle diameter of the borate in powder form can be 500 μm or less. The mean particle diameter of the borate in powder form may be 100 μm or less. The lower limit of the mean particle diameter of the borate in powder form is not particularly limited but can be 5 μm. The use of the borate in powder form reduces a processing time of a grinding process and also improves the efficiency of a later-described plasma process.

In the hydrogenating step, the grinding process of the borate is performed. The grinding process is a process of turning the borate into a fine powder. As an example, a ball mill is used for the grinding process. In the ball mill, the borate and grinding media are contained in the same container and the borate is ground by collision of the grinding media. It should be noted that the ball mill according to the present embodiment, which refers to a ball mill in a broad sense (see Powder Technology Handbook, second edition), is a concept including so-called rolling ball mill (pot mill, tube mill, and conical mill), vibratory ball mill (circular-vibration vibratory mill, turning vibratory mill, and centrifugal mill), and planetary mill.

In the hydrogenating step, the borate being subjected to the grinding process is exposed to a hydrogen plasma for a hydrogen plasma process. The hydrogen plasma contains very highly active hydrogen radicals (H radicals) or hydrogen ions. As a result of the borate being exposed to the hydrogen plasma, bonding sites of oxygen atoms of the borate are broken and the oxygen atoms are removed. Hydrogen atoms are then bonded to electron pairs to which the oxygen atoms were bonded, thereby hydrogenating the borate. For example, in a case where sodium metaborate is used as the borate, it is speculated that the following reaction (1) occurs during the present step.

$$NaBO_2 + 4H_2 \longrightarrow NaBH_4 + 2H_2O \qquad (1)$$

The hydrogen plasma used for the hydrogen plasma process is generated by using a gas containing hydrogen (H) as a constituent element. For example, the hydrogen plasma can be generated by using a source gas containing at least one of a hydrogen gas and a hydrocarbon gas. Examples of the hydrocarbon gas include $CH_4$ gas, $C_2H_2$ gas, or $C_6H_6$ gas. In a case where a gas containing an element more easily oxidizable than hydrogen, such as hydrocarbon, is used, the removal of the oxygen atoms of the borate is accelerated. Improvement in a production speed of a tetrahydroborate is thus expected. The hydrogen plasma may be generated by using $NH_3$ gas or the like.

The source gas may contain a gas more easily oxidizable than hydrogen, such as carbon monoxide. In this case, the removal of the oxygen atoms of the borate is accelerated as in the case where the hydrocarbon gas is employed. Improvement in a production speed of tetrahydroborate is thus expected.

The source gas may contain a gas that produces the Penning effect in combination with hydrogen, such as argon gas, helium gas, or neon gas. In this case, it is possible to stably and widely generate the hydrogen plasma while keeping the plasma density of the hydrogen plasma high. Improvement in a production speed of a tetrahydroborate is thus expected.

As an example, the hydrogen plasma process can be performed by using a plasma generator typically used for a semiconductor process. A processing container where the borate and the source gas are to be supplied is depressurized to, for example, 10 to 150 Pa, approximately. With the pressure regulated within the above range, the hydrogen plasma with a high plasma density can be generated.

The hydrogen plasma may be any one of a low-frequency plasma (a plasma excited by a fluctuating voltage of 1 to 100 kHz), a microwave plasma (a plasma excited by a microwave), and an RF plasma (a plasma excited by RF (Radio Frequency)). These plasmas may be pulse-excited plasmas or may be direct-current-excited plasmas.

Regarding the frequency of the fluctuating voltage that excites the low-frequency plasma, an optimum value may be selected in accordance with the amounts and states of a target substance and the grinding media, the shape and size of the processing container, and the like. The fluctuating voltage is adjusted by using, as an example, a variable frequency power source or the like. The low-frequency plasma, which is available with a simple configuration, allows for reducing both device costs and operational costs to a low level.

The frequency of the microwave used for the excitation of the microwave plasma may be set at, for example, 1 GHz or more, that is, an industrially available frequency band and a frequency band where a thermally non-equilibrated hydrogen plasma with a high plasma density is to be generated. The thermally non-equilibrated plasma is a so-called low-temperature plasma. As an example, a microwave with a frequency of 2.45 GHz is used.

An electric power for exciting the microwave plasma can be 300 W or more. Further, the processing time for the borate to be subjected to the plasma process, which depends on the amount of the borate and the plasma density, can be, for example, 1 hour or less or may be 0.5 hours or less.

In a case where the microwave is used to excite the microwave plasma, a wide-range hydrogen plasma with a high plasma density occurs. This makes it possible to increase the production speed of a tetrahydroborate.

Further, as in the above-described reaction (1), water is generated as a result of reaction of the oxygen atoms having dissociated from the borate with the hydrogen plasma. In a case where the microwave is used to excite the microwave plasma, the microwave enables the water generated by the reaction (1) to be effectively evaporated by heating or ionized. It is thus possible to restrain a reverse reaction where the produced tetrahydroborate and water react back into borate. This makes it possible to increase the production speed of tetrahydroborate.

An excitation frequency used for the generation of the RF plasma is usually 13.56 MHz in Japan in terms of legal regulations; however, the present disclosure is not limited thereto. The RF plasma, which is a plasma widely used in an industrial world, allows for reducing both device costs and operational costs to a low level. The RF plasma enables the generation of a wide-range hydrogen plasma, thus making it possible to increase the production speed of tetrahydroborate.

The hydrogen plasma may be a thermally equilibrated plasma. This makes it possible to increase the plasma density and ion temperature of the hydrogen plasma, enhancing an effect in breaking the bonding sites of the oxygen atoms of the borate to dissociate the oxygen atoms. This makes it possible to increase the production speed of a tetrahydroborate. It should be noted that the thermally equilibrated hydrogen plasma is also referred to as a high-temperature plasma. In a case where the thermally equilibrated plasma is used to process the borate, the water generated by the reaction (1) can be effectively evaporated or ionized by a high energy. It is thus possible to restrain the reverse reaction where the produced tetrahydroborate and water react back into borate. This makes it possible to increase the production speed of a tetrahydroborate.

The low-frequency plasma and the RF plasma may each be a plasma generated by dielectric-barrier discharge. In the dielectric-barrier discharge, an alternating voltage is applied to a gas at least via an insulating body (dielectric) disposed between a pair of electrodes to cause discharge.

The hydrogen plasma may be supplied to the borate as a plasma jet. The plasma jet may be implemented by ejecting the plasma from a nozzle.

In the hydrogenating step, the borate may be exposed to the hydrogen plasma while being heated and ground. A heating temperature can be, as an example, in the range from 40 to 300° C. With the borate exposed to the hydrogen plasma while being heated and ground, the reverse reaction of the reaction (1) can be restrained. It should be noted that in a case where a microwave plasma is used as described above, the microwave can exhibit the above-described effect in restraining the reverse direction.

In the hydrogenating step, a reductant bondable to hydrogen may be simultaneously processed along with the borate. For example, the borate is exposed to the hydrogen plasma while being ground along with the reductant. The reductant bondable to hydrogen traps the oxygen atoms having dissociated from the borate, restraining the oxygen atoms and hydrogen from reacting to generate water. The reverse reaction of the reaction (1) can thus be restrained. Examples of the reductant include reducing metal powder of magnesium (magnesium-based material), aluminum (aluminum-based material), and iron (iron-based material) and carbon powder. It should be noted that in a case where the reductant is used, a step of separating a tetrahydroborate and impurities (mainly, metal oxide) originating from the reductant is sometimes necessary as a subsequent step. However, since the generation of water is restrained by virtue of the effect of the reductant, the efficiency of the hydrogenating step is consequently improved.

In the hydrogenating step, a moisture absorbent may be simultaneously processed along with the borate. For example, the borate is exposed to the hydrogen plasma while being ground along with the moisture absorbent. The moisture absorbent traps water molecules generated as a result of the reaction between the oxygen atoms having dissociated from the borate and the hydrogen plasma. This makes it possible to restrain the reverse reaction of the reaction (1). Examples of the moisture absorbent include quicklime, silica gel, bentonite, magnesium chloride, and calcium chloride. Since the generation of water is restrained by virtue of the effect of the moisture absorbent, the efficiency of the hydrogenating step is improved.

(Preheating Step: Step S12)

The method MT may further include the preheating step of heating the borate prior to the hydrogenating step. The preheating step can be performed under the conditions, which depend on the type and amount of the borate, of, for example, 40 to 300° C. and 0.1 to 1 hour. The preheating step enables removing water contained as crystallization water in a borate hydrate in advance. In this case, since moisture, which is a cause for the reverse reaction of the reaction (1), is absent in the hydrogenating step, the efficiency of the hydrogen plasma process in the hydrogenating step can be improved. The preheating step thus enables an increase in the speed of producing a tetrahydroborate.

(Borate Preparing Step: Step S10)

The method MT may further include the borate preparing step where tetrahydroborate is reacted with water to obtain a borate prior to the hydrogenating step (if the preheating step is included, prior to the preheating step). With use of a tetrahydroborate as a hydrogen carrier, water is added to the tetrahydroborate to extract hydrogen at a hydrogen demand site and, after the use, a residue resulting from the chemical reaction, namely, a borate, is returned to the hydrogen demand site and re-hydrogenated, thereby allowing for recycling the tetrahydroborate. Hydrogen can be transported and stored by repeatedly causing dehydrogenation and re-hydrogenation, thereby making it possible to inexpensively transport and store the hydrogen. For example, in a case where sodium tetrahydroborate is used as a tetrahydroborate, the following reaction (2) is supposed to occur in the present step.

$$NaBH_4 + 2H_2O \longrightarrow NaBO_2 + 4H_2 \quad (2)$$

The reaction (2) is the reverse reaction of the reaction (1).

The explanation on the flowchart of the method MT shown in FIG. 1 is now concluded. According to the method MT shown in FIG. 1, the borate preparing step (step S10), the preheating step (step S12), and the hydrogenating step (step S14) are performed in sequence. It should be noted that in the method MT, only the hydrogenating step (step S14) may be performed, only the borate preparing step (step S10) and the hydrogenating step (step S14) may be performed, or only the preheating step (step S12) and the hydrogenating step (step S14) may be performed.

<Tetrahydroborate to be Produced>

Examples of tetrahydroborate to be produced by the method MT include a hydride corresponding to the borate described above as an example. For example, in a case where a metaborate is used as the borate, examples of the tetrahydroborate include $NaBH_4$, $KBH_4$, $LiBH_4$, $Ca(BH_4)_2$, and $Mg(BH_4)_2$.

The tetrahydroborate to be obtained by the method MT has a composition represented by the following formula (A) or (B).

$$M_xB_yH_z \quad (A)$$

$$N_sB_tH_u \quad (B)$$

In the formula (A), M is at least one selected from the group consisting of Li, Na, and K, x is 0.05 or more and less than 1.0 and may be 0.5 or more and less than 1.0, y is 0.6 or more and less than 1.0, and z is 4.0. In the formula (B), N is at least one selected from the group consisting of Ca and Mg, s is 0.05 or more and less than 1.0 and may be 0.5 or more and less than 1.0, t is 1.2 or more and less than 2.0, and u is 8.0.

As such, the method MT allows for obtaining tetrahydroborate with a composition different from a stoichiometric composition. The reason is not known but it is speculated that the use of the hydrogen plasma for hydrogenation results in a phenomenon where a part of elements (Li, Na, K, Ca, Mg, etc.) in the borate is expelled out by particles that constitute the plasma.

That is, it can be said that such tetrahydroborate is in a plasma-processed product (mixture) of the borate. Accordingly, the composition analysis of a tetrahydroborate allows for detecting whether or not the tetrahydroborate has been obtained by the method MT. That is, tetrahydroborate having the compositions represented by the above formulae (A) and (B) can be used as a marker for determining whether or not the method MT has been used.

<Effects of Producing Method>

According to the method MT, in the hydrogenating step (step S14), the grinding process is simultaneously performed in addition to acceleration of the hydrogenation reaction of the borate by virtue of the high activity of the plasma, thereby achieving a further effect in accelerating the hydrogenation of the borate resulting from a mechanochemical reaction. A mechanochemical effect caused by a local high energy field resulting from the collision of the grinding media causes the bonding sites of the oxygen atoms of the borate to be broken with the oxygen atoms removed and the electron pairs, to which the oxygen atoms have been bonded, bonded to the hydrogen atoms, thereby hydrogenating the borate. Further, with the plasma process and the mechanochemical process simultaneously performed, the local high energy field resulting from the collision of the grinding media is superimposed in a reaction field provided with a high energy field in advance by the plasma. The method MT thus achieves a higher local high energy field not achievable by a conventional method. Therefore, the method MT allows for obtaining a stronger effect in accelerating the hydrogenation of the borate as compared with a conventional method.

Further, the method MT eliminates the necessity of maintaining a reaction container for hydrogenating the borate at a high temperature and a high pressure in the hydrogenating step (step S14). The method MT consequently eliminates the necessity of keeping on externally injecting a large amount of energy. The method MT significantly reduces the processing time by virtue of the use of the hydrogen plasma as compared with a conventional method, making it possible to improve the productivity. Therefore, the method MT allows for high-speed and mass production of a tetrahydroborate.

Further, the method MT does not require a reducing metal (reductant) such as magnesium or aluminum in the hydrogenating step (step S14). The method MT thus eliminates the necessity for raw material costs for the reducing metal, allowing for achieving considerably low costs as compared with a conventional method. Further, in a case of a hydrogenating process using a reducing metal such as magnesium or aluminum, a tetrahydroborate and a metal oxide (magnesium oxide or aluminum oxide) are mixed in a processed target substance. Accordingly, a conventional method requiring a reducing metal needs another process of separating them, which not only raising production costs but also increasing a production time. In contrast, the method MT is free from such a problem. However, the above description is not intended to exclude the use of a reducing metal in the method MT.

The hydrogenating step (step S14), in which a device typically used for a semiconductor process or the like is usable, allows for reducing both device costs and operational costs to a low level.

As such, the method MT including the hydrogenating step (step S14), which allows for achieving low costs and high productivity, is suitable for industrial application.

<Producing Device>

Description is made below on a producing device used for the method MT. The disclosed producing device is one example of a device that implements the method MT and the method MT is not premised on the use of the producing device according to the present disclosure.

Figure 2:
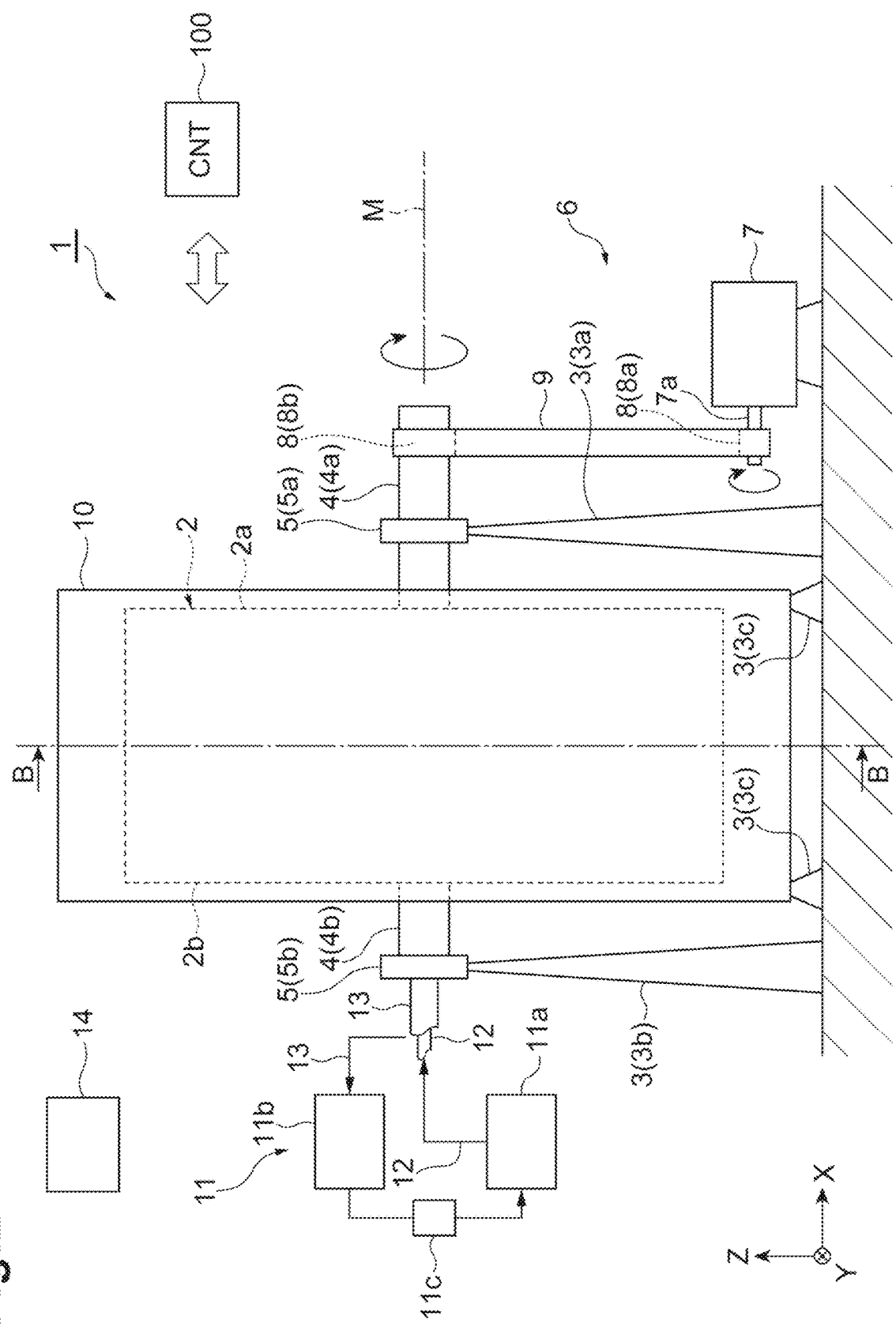
FIG. 2 is a schematic view (front view) showing one example of a device for producing a tetrahydroborate.
Figure 3:
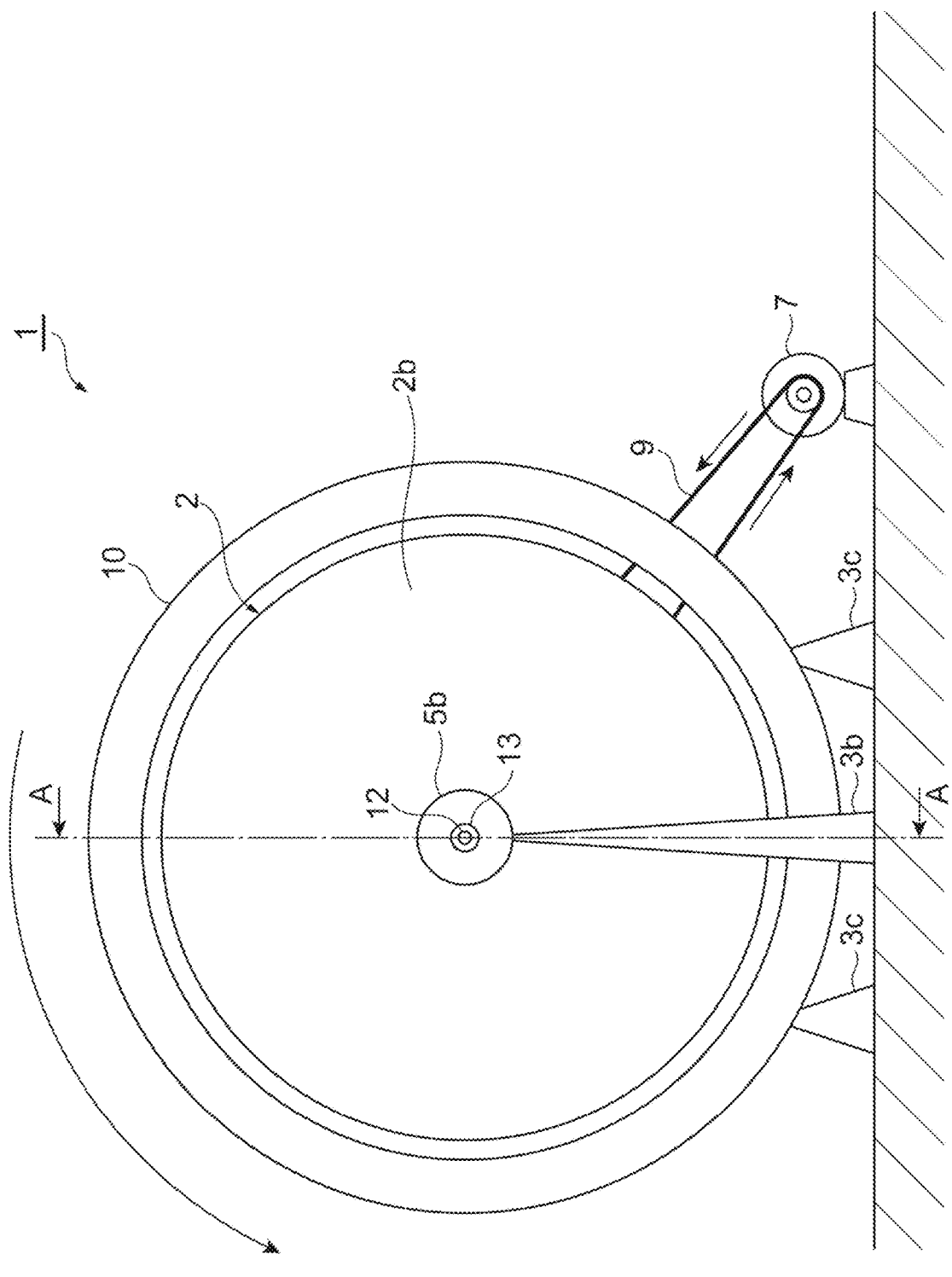
FIG. 3 is a schematic view (side view) showing one example of the device for producing a tetrahydroborate.

FIG. 2 is a schematic view (front view) showing one example of a device for producing a tetrahydroborate. FIG. 3 is a schematic view (side view) showing one example of the device for producing a tetrahydroborate. A producing device 1 shown in FIG. 2 and FIG. 3 is a device that allows a grinding process with a ball mill and a plasma process to be performed in the same container.

The producing device 1 includes a ball mill container 2. The ball mill container 2 includes therein a processing chamber for grinding media and borate to be contained. The processing chamber is a sealable space where the grinding process and the plasma process are to be performed. The processing chamber is opened to contain the grinding media and the borate. The detail of the processing chamber will be described later. As an example, the ball mill container 2 is a cylindrical heat resistant and pressure resistant container. The material of the ball mill container 2 can be a metal material (steel material) that does not affect the hydrogenation reaction of the borate and is less affected by hydrogen embrittlement.

The ball mill container 2 is rotatably supported via stands 3a and 3b. Ball mill shafts 4a and 4b are coupled to the respective center portions of both end surfaces 2a and 2b of the ball mill container 2. The ball mill shafts 4a and 4b are each provided along a rotation axis M extending in an X-direction in the figure. The ball mill shafts 4a and 4b are respectively rotatably supported by bearings 5a and 5b supported by the stands 3a and 3b.

The producing device 1 includes a drive 6 that causes the ball mill container 2 to rotate. The drive 6 causes the ball mill container 2 to rotate to grind the borate. The drive 6 includes a motor 7, pulleys 8a and 8b, and a drive belt 9. The motor 7, which is a drive source, includes a motor shaft 7a, that is, a rotary drive shaft. The pulley 8a is provided on the motor shaft 7a and the pulley 8b is provided on the ball mill shaft 4a. The drive belt 9 is wound on the outer periphery of each of the pulleys 8a and 8b. The rotary force of the motor shaft 7a is transferred to the ball mill shaft 4a through the drive belt 9. This causes the ball mill container 2, which is coupled to the ball mill shaft 4a, to rotate. In the processing chamber inside the ball mill container 2, the grinding media generate a trituration force and an impact force with the rotation of the ball mill container 2. The borate is thus subjected to the mechanochemical process.

The outer periphery of the ball mill container 2 is provided with a heater 10 at a distance. The heater 10 is cylindrical with the ball mill container 2 disposed therein. The heater 10 is supported by a stand 3c, which is different from the stands 3a and 3b supporting the ball mill container 2. The ball mill container 2 thus rotates inside the immobile heater 10. The heater 10, which is coupled to an unshown power source, externally heats the ball mill container 2 to perform temperature adjustment of the processing chamber.

The producing device 1 includes an atmosphere adjuster 11 that adjusts the atmosphere (gaseous species, pressure) in the processing chamber. The atmosphere adjuster 11 includes a gas supplying unit 11a and a gas discharging unit 11b. The gas supplying unit 11a supplies a source gas to the processing chamber, making an atmosphere of the source gas in the processing chamber. The gas supplying unit 11a is coupled to an unshown gas source of the source gas to supply the source gas from the gas source to the processing chamber. The gas source is a source of a hydrocarbon gas, a hydrogen gas, a hydrogen-mixed gas, or the like. The gas discharging unit 11b, which includes an unshown vacuum pump, causes the gas in the processing chamber to be discharged to depressurize the processing chamber.

The ball mill shaft 4b is hollow. A gas supply path 12 and a gas discharge path 13 are disposed inside the ball mill shaft 4b. The gas supply path 12 is provided inside the gas discharge path 13. That is, the gas supply path 12 is disposed inside and the gas discharge path 13 is disposed outside, configuring a double pipe. The gas supplying unit 11a supplies the source gas to the processing chamber through the gas supply path 12. The gas discharging unit 11b adjusts the pressure in the processing chamber through the gas discharge path 13.

The gas discharging unit 11b and the gas supplying unit 11a are coupled via a cooling capacitor 11c. The cooling capacitor 11c separates the source gas and moisture from the discharged gas. The gas discharged by the gas discharging unit 11b is separated into the source gas and moisture through the cooling capacitor 11c and only the source gas is returned to the gas supplying unit 11a. The source gas is thus circulated.

The ball mill container 2 is provided with a plasma generator that generates a hydrogen plasma. With a voltage applied from a power source 14, the plasma generator generates the hydrogen plasma. The plasma generator is implemented in a variety of aspects as described below.

<First Plasma Generator>

Figure 4:
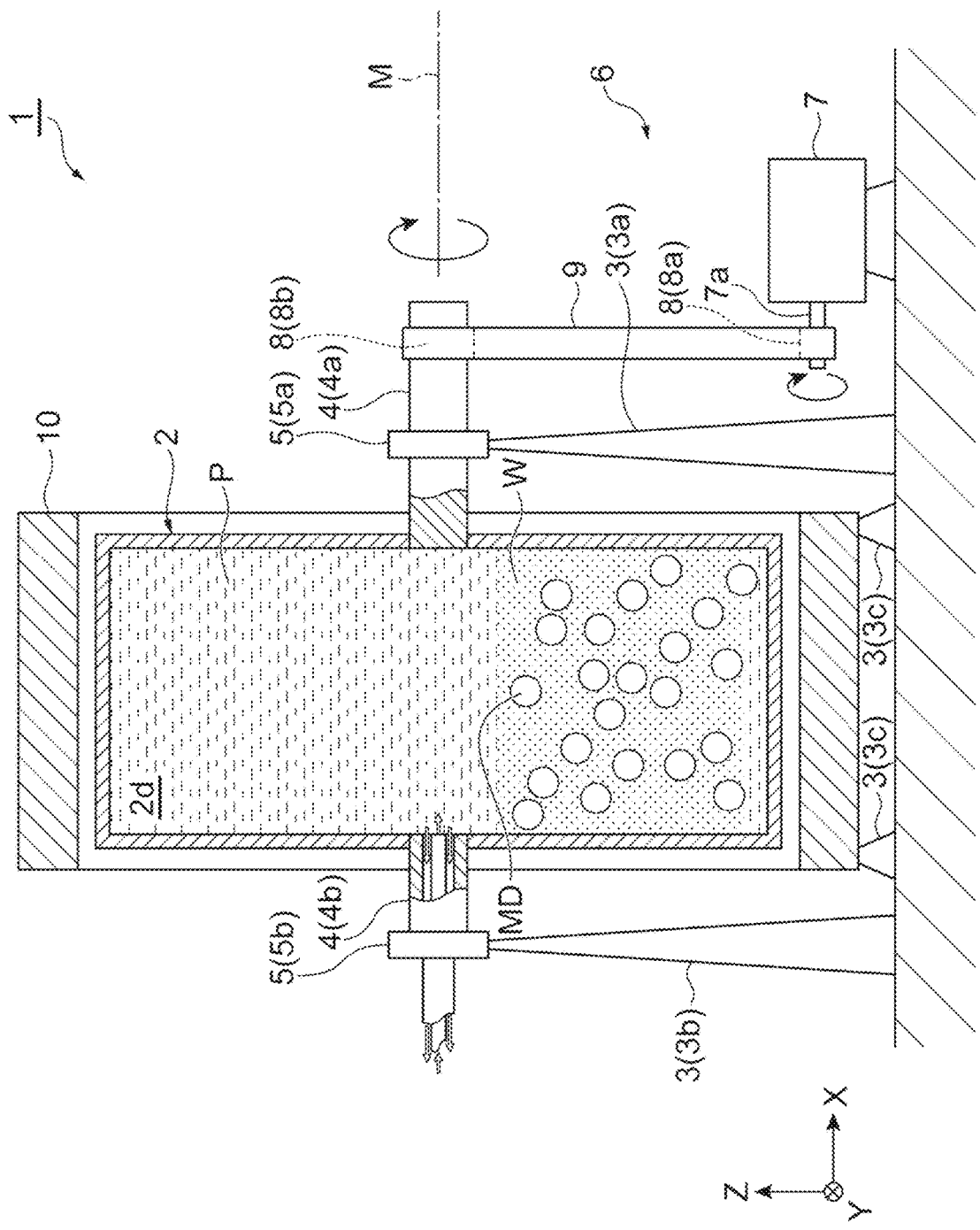
FIG. 4 is a cross-sectional view along A-A in FIG. 3, showing a producing device including a first plasma generator.
Figure 5:
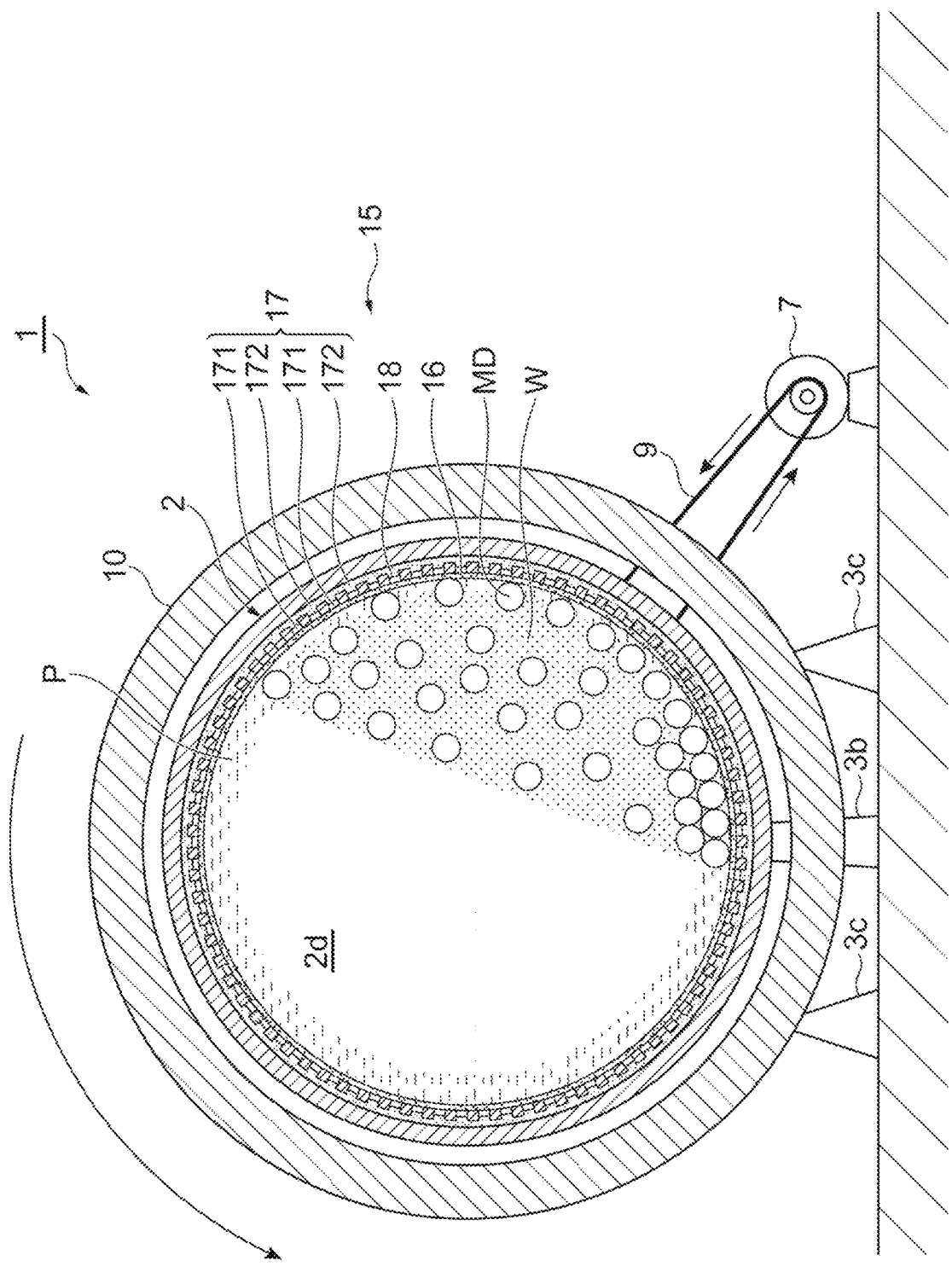
FIG. 5 is a cross-sectional view along B-B in FIG. 2, showing the producing device including the first plasma generator.

FIG. 4 is a cross-sectional view along A-A in FIG. 3, showing a producing device including a first plasma generator. FIG. 5 is a cross-sectional view along B-B in FIG. 2, showing the producing device including the first plasma generator. As shown in FIG. 4 and FIG. 5, a processing chamber 2d is defined inside the ball mill container 2. Grinding media MD and a borate W are contained in the processing chamber 2d.

A first plasma generator 15 includes a dielectric member 16, a pair of electrodes 17, and an insulating body 18. The first plasma generator 15 is configured as a stacked body with the insulating body 18, the pair of electrodes 17, and the dielectric member 16 stacked in sequence on an inner wall of the ball mill container 2.

The insulating body 18 is provided on the circumferential curved inner wall of the ball mill container 2. The insulating body 18 may be provided all over the inner wall of the ball mill container 2. The insulating body 18 insulates the pair of electrodes 17 from each other. The insulating body 18 also electrically insulates the pair of electrodes 17 and the ball mill container 2 from each other. Examples of the material of the insulating body 18 include polyimide and ultra-high molecular weight polyethylene.

The pair of electrodes 17 are coupled to the dielectric member 16 and a voltage is applied thereto from the power source 14 (FIG. 1). The pair of electrodes 17 is provided in such a way as to be in contact with the dielectric member 16. As an example, the power source 14 is a variable power source the frequency of the supply voltage of which is variable in the range from 1 to 50 kHz. The power source 14 supplies a voltage at an optimum frequency based on the amount of the contents, the state of the source gas, and the like. The power source 14 is electrically coupled to the pair of electrodes 17 via an unshown slip ring provided on the ball mill shaft 4a. The pair of electrodes 17, which include a first electrode 171 and a second electrode 172, are provided on a surface of the insulating body 18. The first electrode 171 and the second electrode 172 are disposed at a distance not to be directly electrically continuous with each other. A plurality of pairs of electrodes 17 may be disposed on the circumference of the ball mill container 2. First electrodes 171 and second electrodes 172 of the plurality of pairs of electrodes 17 are disposed on the circumference of the ball mill container 2 at regular intervals. The first electrodes 171 and the second electrodes 172, each of which are in the form of a comb, are disposed in such a way that the combs are symmetrically combined. The material of the pair of electrodes 17 is a metal with electrical conductivity or the like, examples of which include copper, brass, iron, and aluminum. It should be noted that the pair of electrodes 17 may include at least one pair of electrodes. For example, the pair of electrodes 17 may be a group of three pairs of electrodes in the form of a three-phase electrode.

The dielectric member 16 is provided on a surface of each of the pair of electrodes 17 and the insulating body 18. A surface of the dielectric member 16 faces the processing chamber 2d. That is, the dielectric member 16 constitutes at least a portion of an inner wall surface of the processing chamber 2d. In the example of FIGS. 4 and 5, the dielectric member 16 constitutes a circumferential curved inner wall of the processing chamber 2d. Since the dielectric member 16 is to be directly in contact with the grinding media MD, a material excellent in abrasion resistance, heat resistance, and voltage resistance is used therefor. The material of the dielectric member 16 is a resin dielectric, examples of which include polyimide.

The first plasma generator 15 generates a hydrogen plasma P on the surface of the dielectric member 16 by virtue of dielectric-barrier discharge based on the voltage applied from the power source 14 in the processing chamber 2d within the atmosphere of the source gas. The first plasma generator 15 thus causes the borate W to be exposed to the hydrogen plasma P during the rotation of the ball mill container 2.

<Second Plasma Generator>

Figure 6:
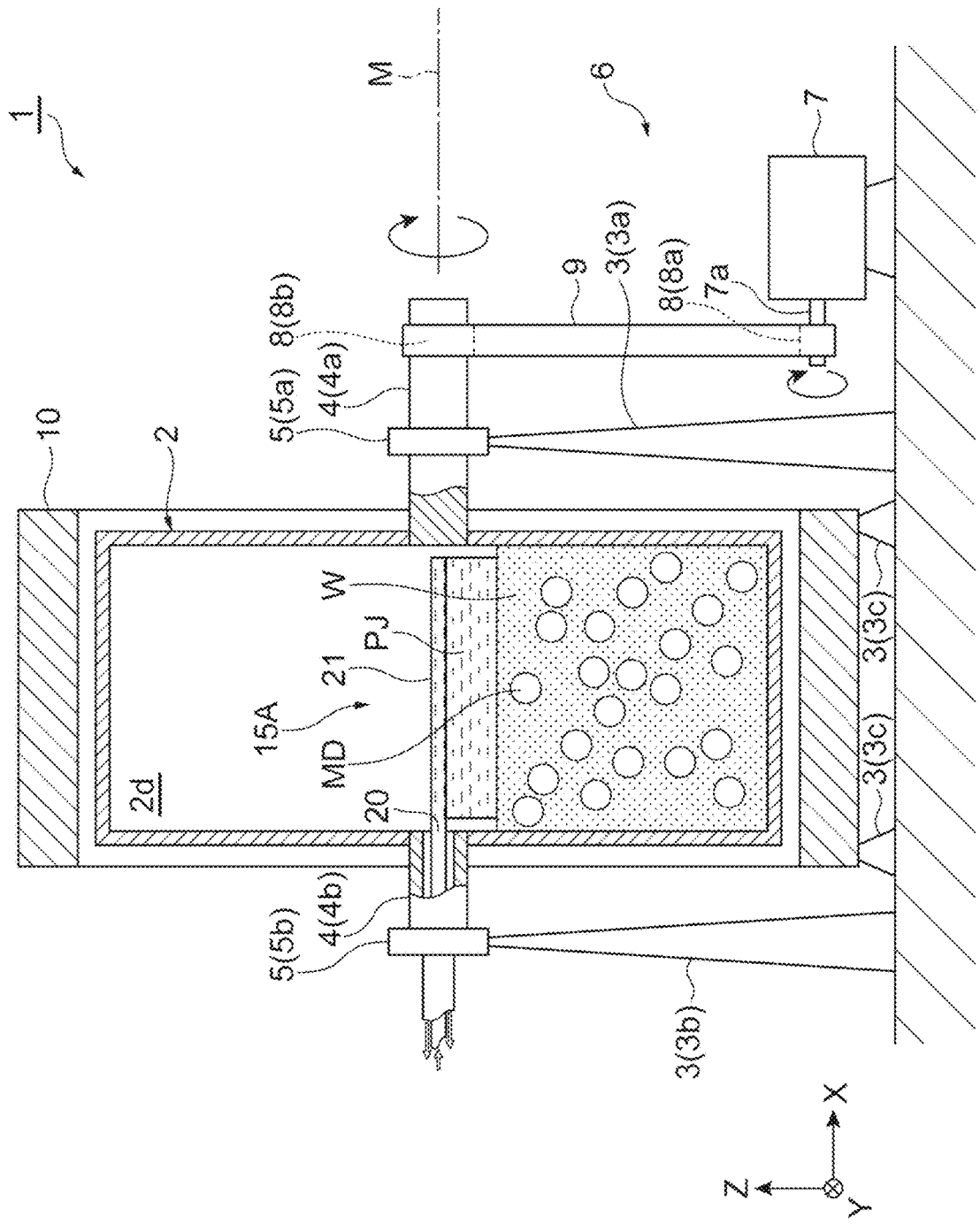
FIG. 6 is a cross-sectional view along A-A in FIG. 3, showing a producing device including a second plasma generator.
Figure 7:
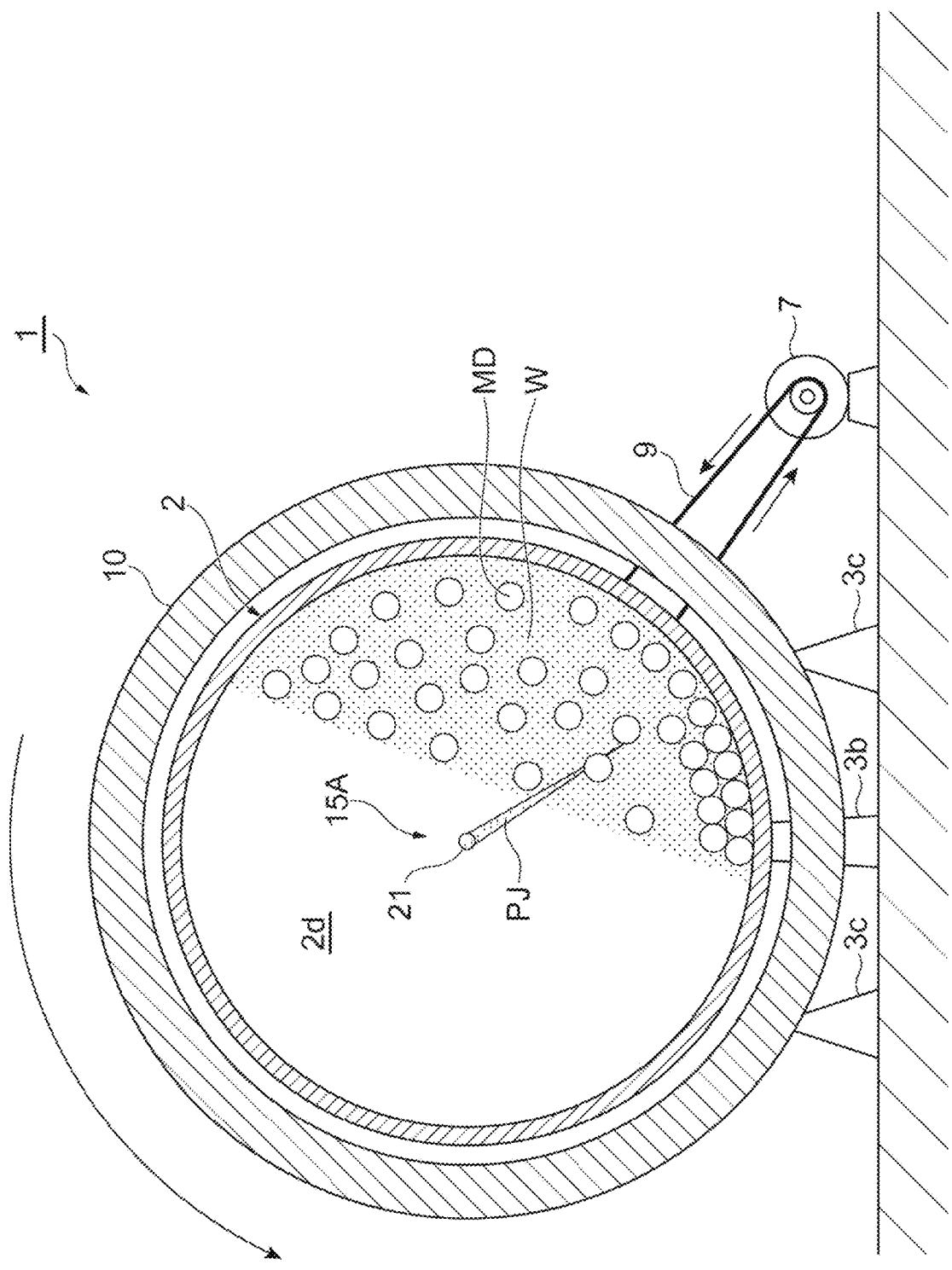
FIG. 7 is a cross-sectional view along B-B in FIG. 2, showing the producing device including the second plasma generator.

FIG. 6 is a cross-sectional view along A-A in FIG. 3, showing a producing device including a second plasma generator. FIG. 7 is a cross-sectional view along B-B in FIG. 2, showing the producing device including the second plasma generator. As shown in FIG. 6 and FIG. 7, the processing chamber 2d is defined inside the ball mill container 2. The grinding media MD and the borate W are contained in the processing chamber 2d.

A second plasma generator 15A is configured to be able to generate a plasma jet of a hydrogen plasma when a voltage is applied thereto. The second plasma generator 15A includes a main body 20 in the form of a hollow pipe and a plasma jet nozzle 21.

The main body 20 includes an unshown electrode in an inner space thereof. The material of the electrode is a metal with electrical conductivity or the like, examples of which include copper, brass, iron, and aluminum. The source gas is supplied to the inner space of the main body 20 from the gas supplying unit 11a (FIG. 1) through the gas supply path 12. A voltage is applied to the electrode of the main body 20 from the power source 14 (FIG. 1). As an example, the power source 14 is a variable power source the frequency of the supply voltage of which is variable in the range from 1 to 50 kHz. The power source 14 supplies a voltage at an optimum frequency based on the amount of the contents, the state of the source gas, and the like. The power source 14 is electrically coupled to the electrode of the plasma jet nozzle 21 via an unshown slip ring provided on the ball mill shaft 4a. The material of the main body 20 is, for example, a dielectric (as an example, high-purity alumina). In the main body 20, the plasma jet is generated based on the voltage applied from the power source 14 and the source gas supplied from the gas supplying unit 11a.

The plasma jet nozzle 21 is provided at the distal end of the main body 20. The plasma jet nozzle 21 is disposed on the center axis of the processing chamber 2d of the ball mill container 2. The plasma jet nozzle 21, which is in the form of a hollow pipe, has an intermittent hole linearly formed in a pipe length direction. A plasma jet PJ of the hydrogen plasma is ejected through this intermittent hole. The plasma jet nozzle 21 is fixedly disposed in the processing chamber 2d in such a way as to eject the plasma jet to an accumulated spot of the grinding media MD and the borate W contained in the processing chamber 2d. As an example, the ejection angle of the plasma jet nozzle 21 is set to enable ejection toward the vicinity of a lower portion of the processing chamber 2d where the kinetic energy of the grinding media MD is maximized. The material of the plasma jet nozzle 21 is, for example, a dielectric (as an example, high-purity alumina).

The plasma jet nozzle 21 is likely to be in direct contact with the grinding media MD. Accordingly, the amount of the grinding media MD and the rotation speed of the ball mill container 2 may be adjusted in such a way as to prevent the grinding media MD from passing through a center portion of the processing chamber 2d.

The second plasma generator 15A generates the plasma jet PJ of the hydrogen plasma based on the voltage applied from the power source 14 in the processing chamber 2d. The second plasma generator 15A thus causes the borate W to be exposed to the hydrogen plasma during the rotation of the ball mill container 2.

<Third Plasma Generator>

Figure 8:
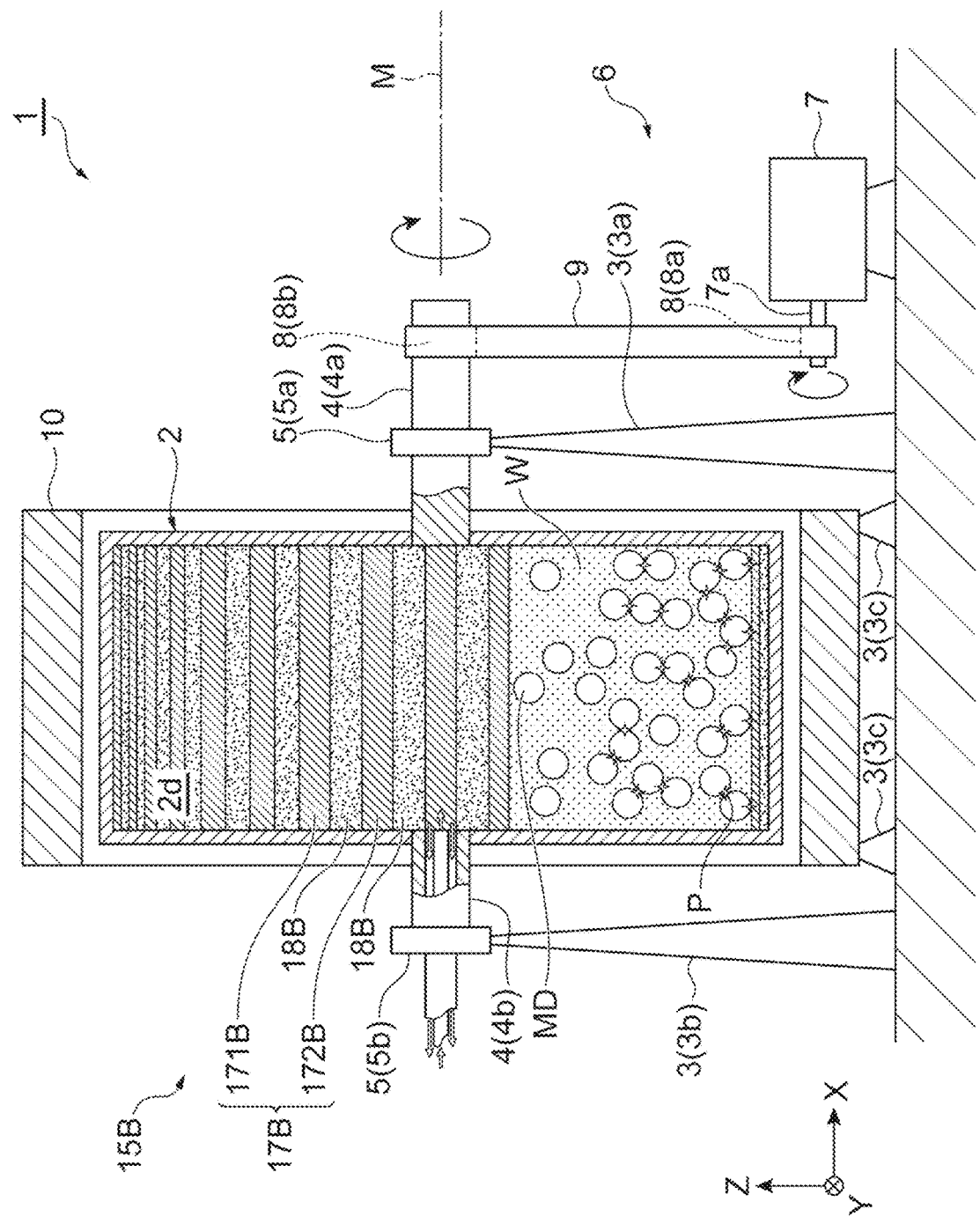
FIG. 8 is a cross-sectional view along A-A in FIG. 3, showing a producing device including a third plasma generator.
Figure 9:
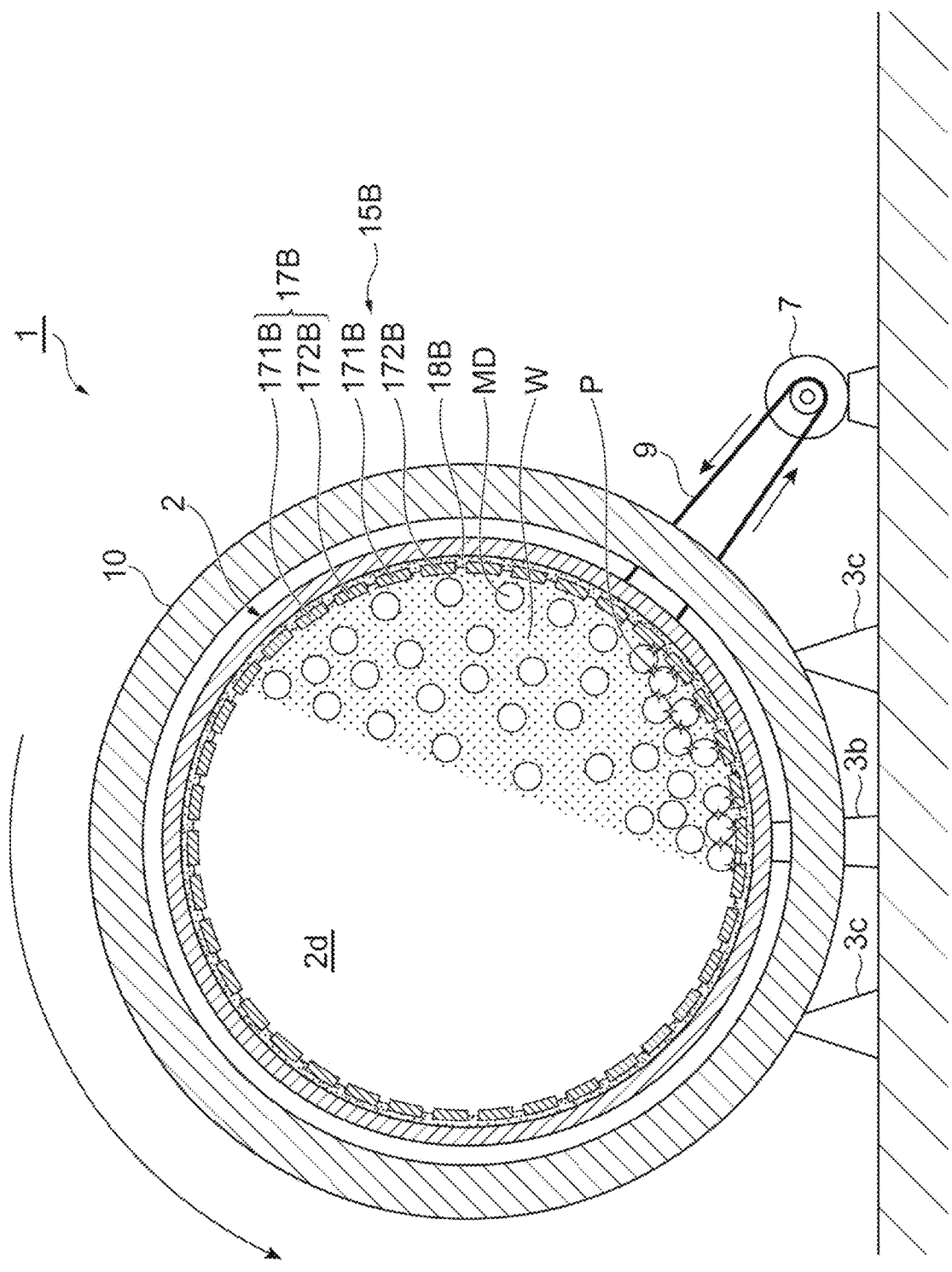
FIG. 9 is a cross-sectional view along B-B in FIG. 2, showing the producing device including the third plasma generator.

FIG. 8 is a cross-sectional view along A-A in FIG. 3, showing a producing device including a third plasma generator. FIG. 9 is a cross-sectional view along B-B in FIG. 2, showing the producing device including the third plasma generator. As shown in FIG. 8 and FIG. 9, the processing chamber 2d is defined inside the ball mill container 2. The grinding media MD and the borate W are contained in the processing chamber 2d.

A third plasma generator 15B includes a pair of electrodes 17B and an insulating body 18B. The third plasma generator 15B is configured as a stacked body with the insulating body 18B and the pair of electrodes 17B stacked in sequence on the inner wall of the ball mill container 2.

The insulating body 18B is disposed on the circumferential curved inner wall of the ball mill container 2. The insulating body 18B may be provided all over the inner wall of the ball mill container 2. The insulating body 18B insulates the pair of electrodes 17B from each other. The insulating body 18B also electrically insulates the pair of electrodes 17B and the ball mill container 2 from each other. Examples of the material of the insulating body 18B include polyimide and ultra-high molecular weight polyethylene.

A voltage is applied to the pair of electrodes 17B from the power source 14 (FIG. 1). As an example, the power source 14 is a power source able to supply a pulse voltage. Assuming that, for example, the cycle of the pulse voltage is 10 ins per cycle, the power source 14 adjusts a duty ratio (an interval between energization and non-energization) within the range of 1:9 to 9:1. The power source 14 supplies the pulse voltage at an optimum duty ratio based on the amount of the contents, the state of the source gas, and the like. The pulse-application of the voltage can reduce a rise in the temperature of a spark (plasma) that occurs between the grinding media MD to prevent the grinding media MD from being melted to stick. The power source 14 is electrically coupled to the pair of electrodes 17B via an unshown slip ring provided on the ball mill shaft 4a. The pair of electrodes 17B, which include a first electrode 171B and a second electrode 172B, are provided on a surface of the insulating body 18B. The first electrode 171B and the second electrode 172B are disposed at a distance not to be directly electrically continuous with each other. A plurality of pairs of electrodes 17B may be disposed on the circumference of the ball mill container 2. First electrodes 171B and second electrodes 172B of the plurality of pairs of electrodes 17B are disposed on the circumference of the ball mill container 2 at regular intervals. The first electrodes 171B and the second electrodes 172B extend along the direction of the center axis of the ball mill container 2 (the direction orthogonal to the circumferential direction).

Surfaces of the pair of electrodes 17B face the processing chamber 2d. That is, the pair of electrodes 17B constitute at least a portion of the inner wall surface of the processing chamber 2d. In the example of FIGS. 8 and 9, the pair of electrodes 17B constitute a portion of the circumferential curved inner wall of the processing chamber 2d. The material of the pair of electrodes 17B is a metal with electrical conductivity or the like, examples of which include copper, brass, iron, and aluminum. It should be noted that the pair of electrodes 17B may include at least one pair of electrodes. For example, the pair of electrodes 17B may be a group of three pairs of electrodes in the form of a three-phase electrode.

It should be noted that the processing chamber 2d is provided with an unshown lifter member in some cases. The lifter member is a member for lifting the contents in the processing chamber 2d with the rotation of the container, that is, for example, a member erected from the inner wall of the processing chamber 2d toward the center. The pair of electrodes 17B may constitute at least a portion of such a lifter member.

The grinding media MD exhibit electrical conductivity at least at surfaces thereof. The grinding media MD come into contact with the pair of electrodes 17B, that is, a portion of the circumferential curved inner wall of the processing chamber 2d, causing an energization state between the pair of electrodes 17B to change. During the rotation of the ball mill container 2, the grinding media MD flows, causing the energization state between the pair of electrodes 17B to steadily change. With the pulse voltage applied from the power source 14 in the processing chamber 2d within the atmosphere of the source gas, the third plasma generator 15B generates the hydrogen plasma P in the form of a spark on the surfaces of the grinding media MD during the rotation of the ball mill container 2. The third plasma generator 15B thus causes the borate W to be exposed to the hydrogen plasma P during the rotation of the ball mill container 2.

<Fourth Plasma Generator>

Figure 10:
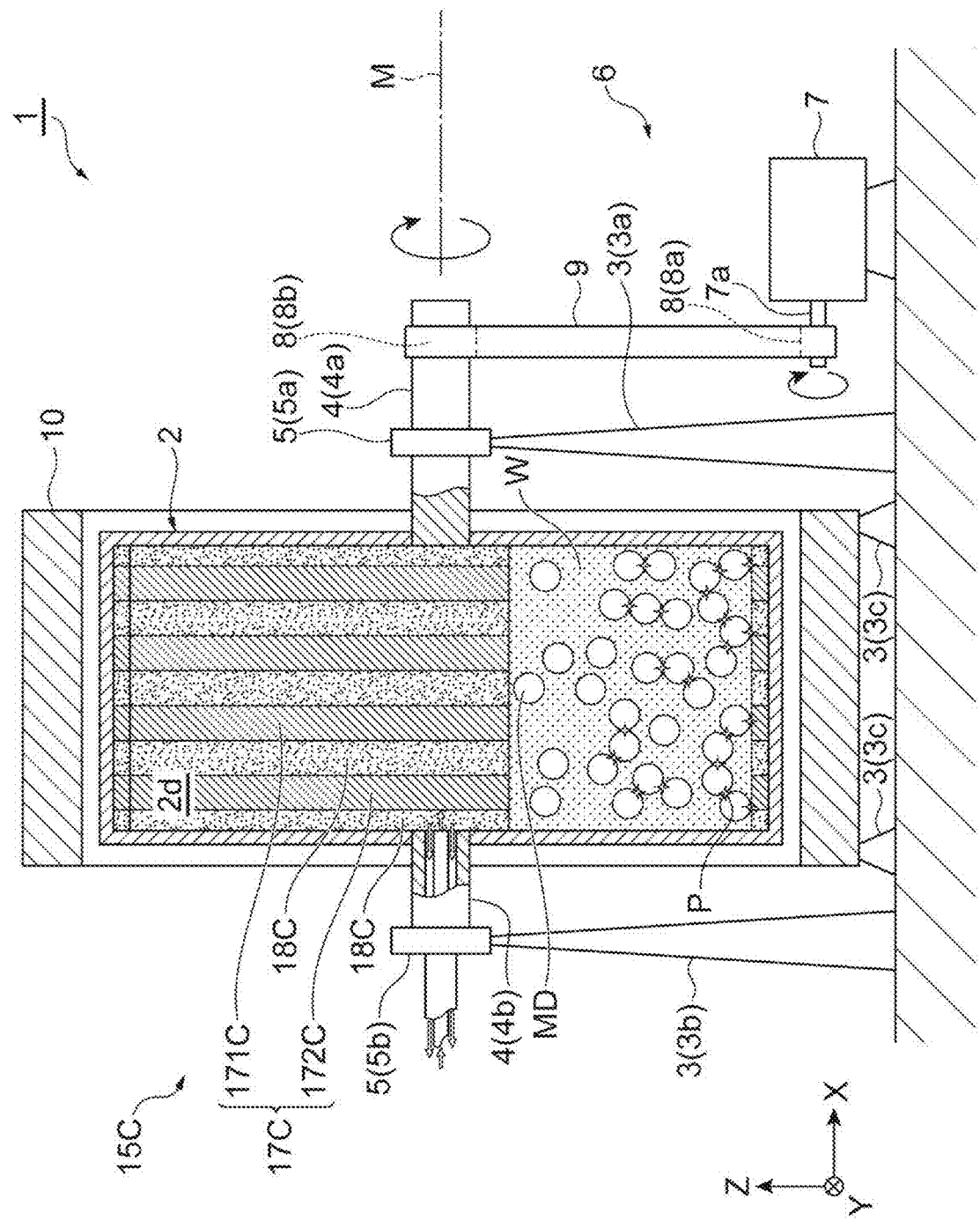
FIG. 10 is a cross-sectional view along A-A in FIG. 3, showing a producing device including a fourth plasma generator.
Figure 11:
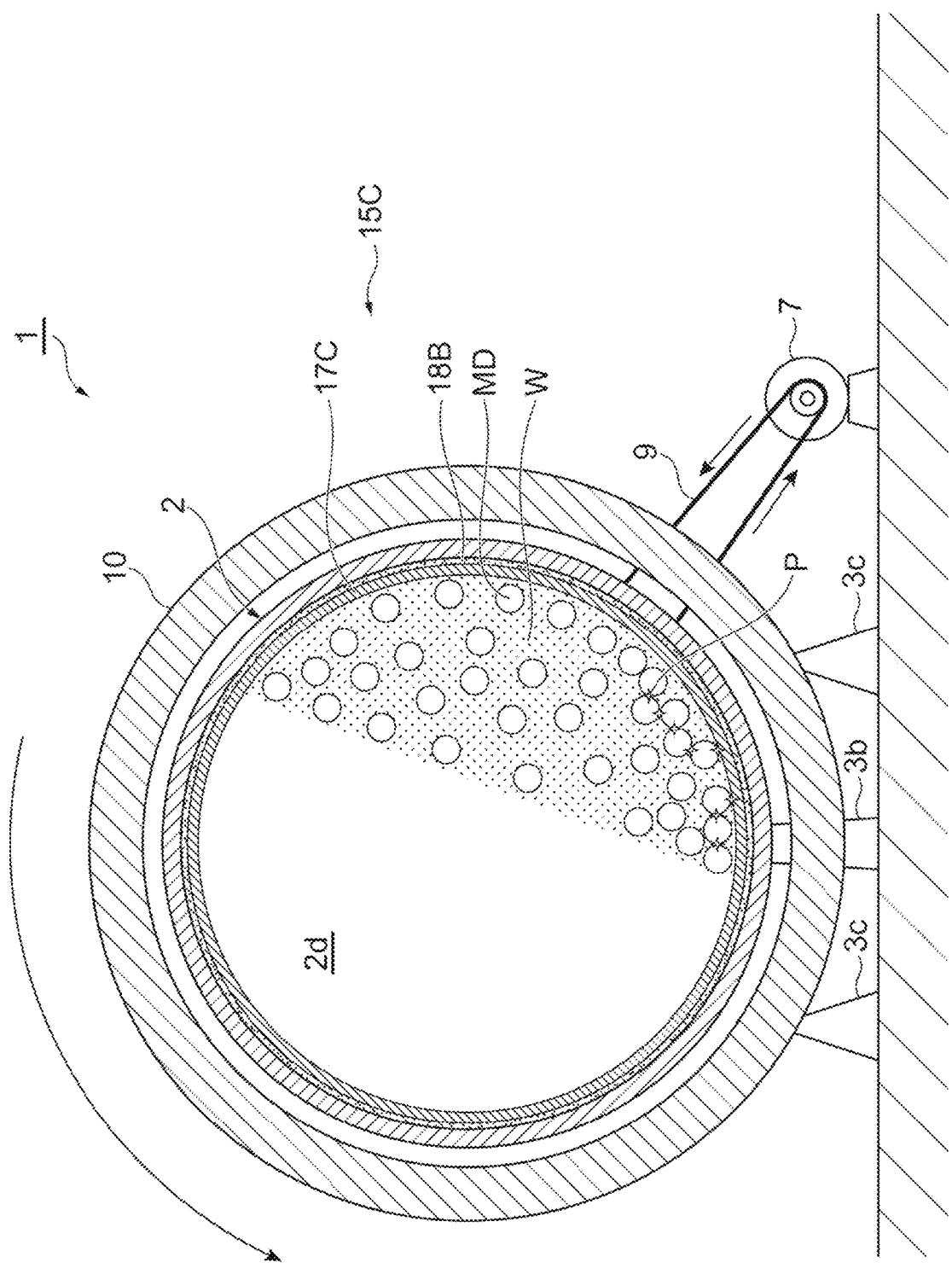
FIG. 11 is a cross-sectional view along B-B in FIG. 2, showing the producing device including the fourth plasma generator.

FIG. 10 is a cross-sectional view along A-A in FIG. 3, showing a producing device including a fourth plasma generator. FIG. 11 is a cross-sectional view along B-B in FIG. 2, showing the producing device including the fourth plasma generator. As shown in FIG. 10 and FIG. 11, the processing chamber 2d is defined inside the ball mill container 2. The grinding media MD and the borate W are contained in the processing chamber 2d.

A fourth plasma generator 15C includes a pair of electrodes 17C and an insulating body 18C. The fourth plasma generator 15C is configured as a stacked body with the insulating body 18C and the pair of electrodes 17C stacked in sequence on an inner wall of the ball mill container 2.

As compared with the third plasma generator 15B, the fourth plasma generator 15C is different in the extending direction of the pair of electrodes 17C but the same in the other configuration. A first electrode 171C and a second electrode 172C extend along the direction orthogonal to the center axis of the ball mill container 2 (circumferential direction). It should be noted that the pair of electrodes 17C may include at least one pair of electrodes. For example, the pair of electrodes 17C may be a group of three pairs of electrodes in the form of a three-phase electrode.

With the pulse voltage applied from the power source 14 in the processing chamber 2d within the atmosphere of the source gas, the fourth plasma generator 15C generates the hydrogen plasma P in the form of a spark on the surfaces of the grinding media MD during the rotation of the ball mill container 2. The fourth plasma generator 15C thus causes the borate W to be exposed to the hydrogen plasma P during the rotation of the ball mill container 2.

<Fifth Plasma Generator>

Figure 12:
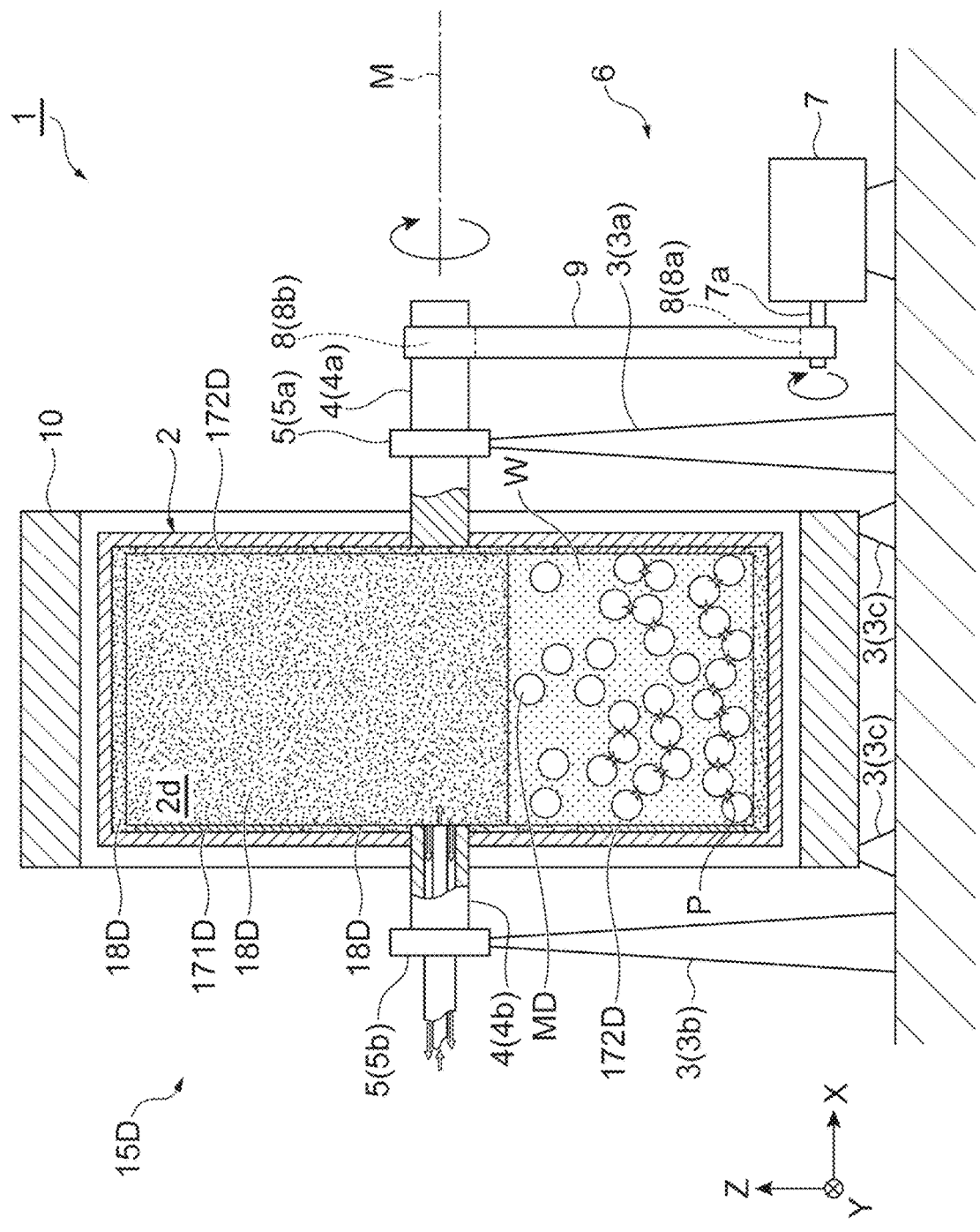
FIG. 12 is a cross-sectional view along A-A in FIG. 3, showing a producing device including a fifth plasma generator.
Figure 13:
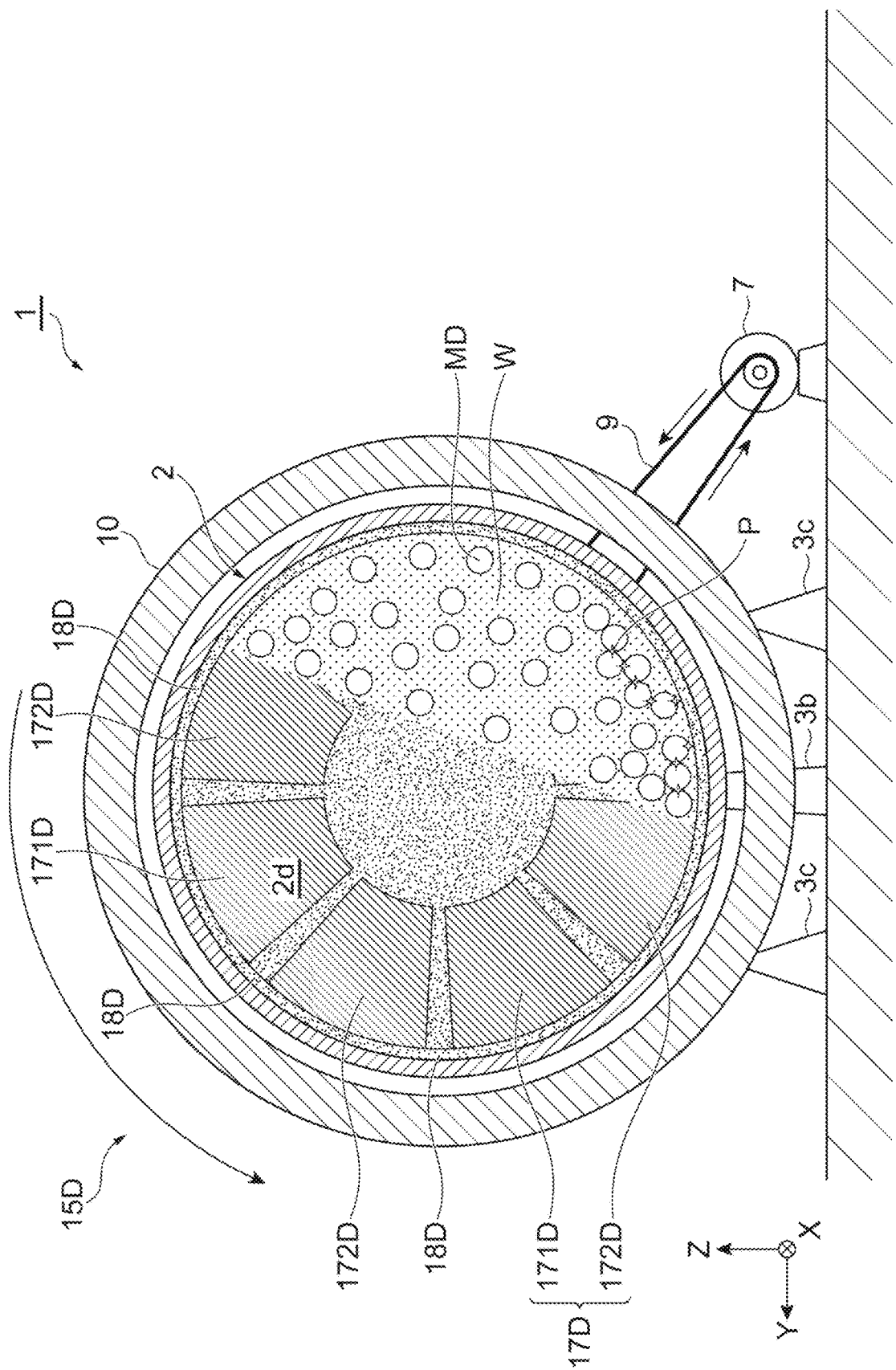
FIG. 13 is a cross-sectional view along B-B in FIG. 2, showing the producing device including the fifth plasma generator.

FIG. 12 is a cross-sectional view along A-A in FIG. 3, showing a producing device including a fifth plasma generator. FIG. 13 is a cross-sectional view along B-B in FIG. 2, showing the producing device including the fifth plasma generator. As shown in FIG. 12 and FIG. 13, the processing chamber 2d is defined inside the ball mill container 2. The grinding media MD and the borate W are contained in the processing chamber 2d.

A fifth plasma generator 15D includes a pair of electrodes 17D and an insulating body 18D. The fifth plasma generator 15D is configured as a stacked body with the insulating body 18D and the pair of electrodes 17D stacked in sequence on an inner wall of the ball mill container 2.

As compared with the third plasma generator 15B, the fifth plasma generator 15D is different in the locations of the insulating body 18D and the pair of electrodes 17C but the same in the other configuration. The insulating body 18D is disposed on inner walls of both of both end surfaces and circumferential surface of the processing chamber 2d. The insulating body 18D may be disposed only on the inner walls of both the end surfaces of the processing chamber 2d. A first electrode 171D and a second electrode 172D are annularly disposed on the inner walls of both the end surfaces of the processing chamber 2d in such a way as to surround a rotation shaft of the ball mill container 2. The first electrode 171D and the second electrode 172D are alternately disposed along a rotation direction. It should be noted that the pair of electrodes 17D may include at least one pair of electrodes. For example, the pair of electrodes 17D may be a group of three pairs of electrodes in the form of a three-phase electrode.

With the pulse voltage applied from the power source 14 in the processing chamber 2d within the atmosphere of the source gas, the fifth plasma generator 15D generates the hydrogen plasma P in the form of a spark on the surfaces of the grinding media MD during the rotation of the ball mill container 2. The fifth plasma generator 15D thus causes the borate W to be exposed to the hydrogen plasma P during the rotation of the ball mill container 2.

<Sixth Plasma Generator>

Figure 14:
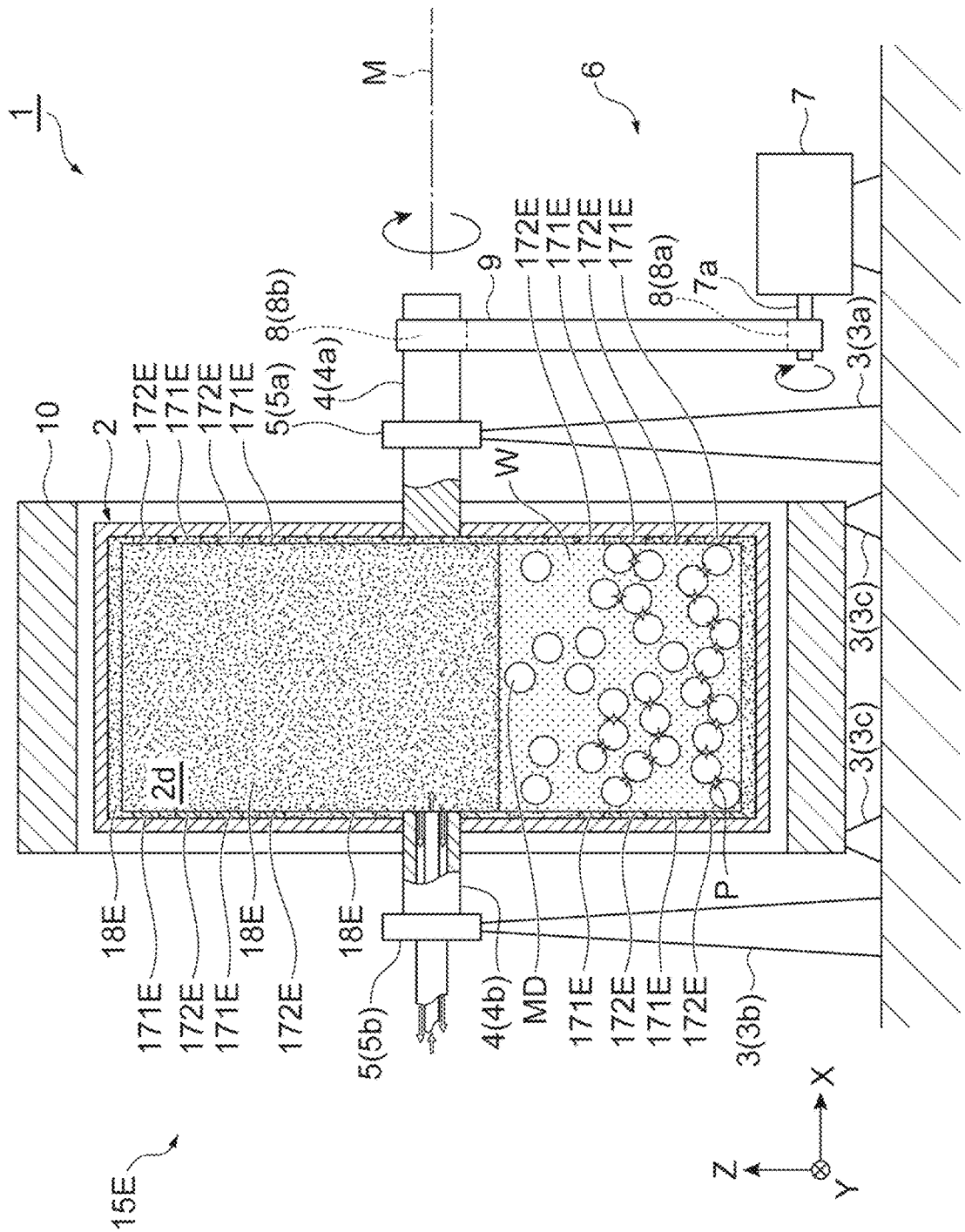
FIG. 14 is a cross-sectional view along A-A in FIG. 3, showing a producing device including a sixth plasma generator.
Figure 15:
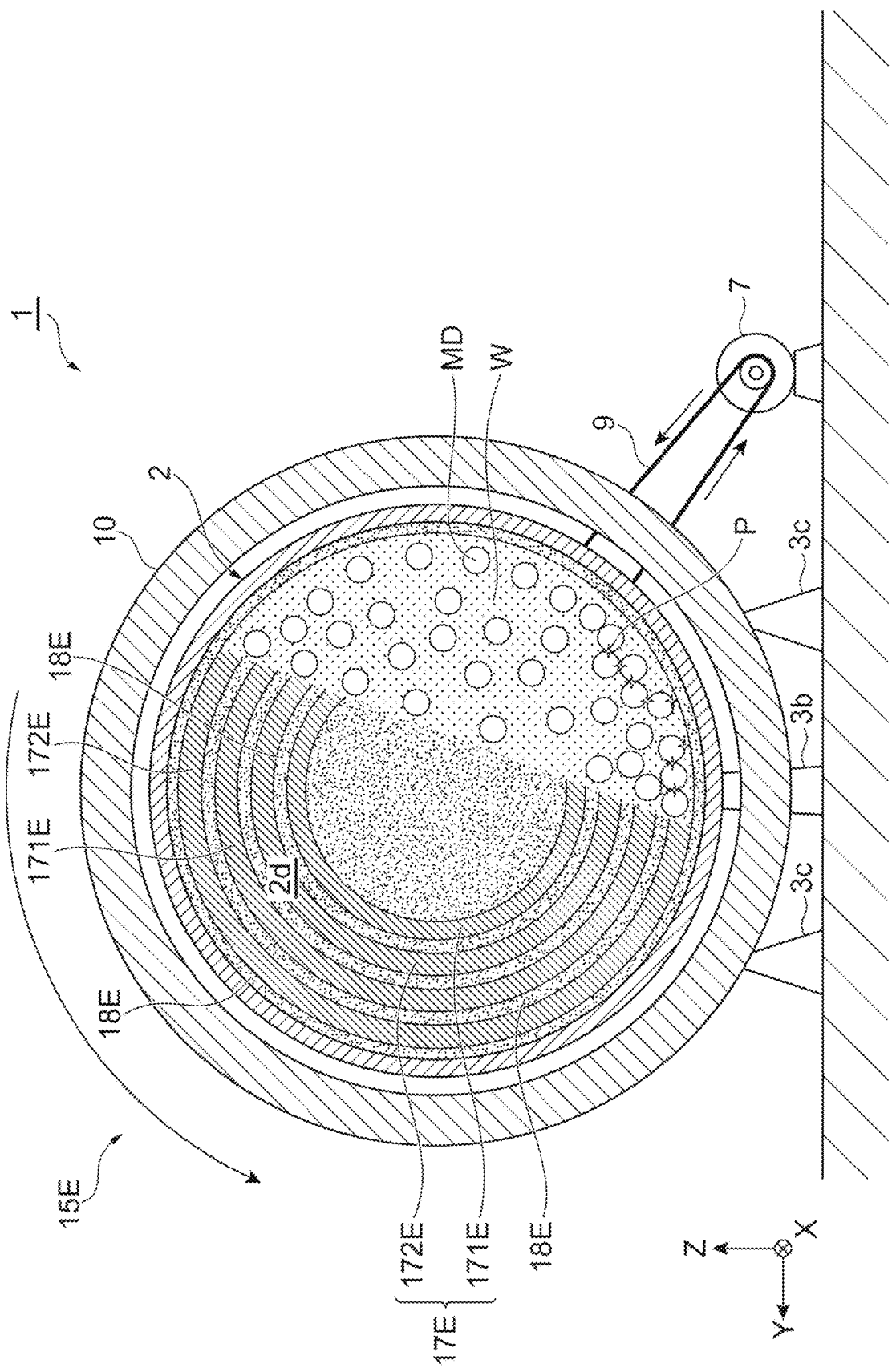
FIG. 15 is a cross-sectional view along B-B in FIG. 2, showing the producing device including the sixth plasma generator.

FIG. 14 is a cross-sectional view along A-A in FIG. 3, showing a producing device including a sixth plasma generator. FIG. 15 is a cross-sectional view along B-B in FIG. 2, showing the producing device including the sixth plasma generator. As shown in FIG. 14 and FIG. 15, the processing chamber 2d is defined inside the ball mill container 2. The grinding media MD and the borate W are contained in the processing chamber 2d.

A sixth plasma generator 15E includes a pair of electrodes 17E and an insulating body 18E. The sixth plasma generator 15E is configured as a stacked body with the insulating body 18E and the pair of electrodes 17E stacked in sequence on an inner wall of the ball mill container 2.

As compared with the fifth plasma generator 15D, the sixth plasma generator 15E is different in the shape and location of the pair of electrodes 17E but the same in the other configuration. A first electrode 171E and a second electrode 172E are concentrically disposed on the inner walls of both the end surfaces of the processing chamber 2d in such a way as to surround the rotation shaft of the ball mill container 2. The first electrode 171E and the second electrode 172E are alternately disposed in a radial direction. It should be noted that the pair of electrodes 17E may include at least one pair of electrodes. For example, the pair of electrodes 17E may be a group of three pairs of electrodes in the form of a three-phase electrode.

With the pulse voltage applied from the power source 14 in the processing chamber 2d within the atmosphere of the source gas, the sixth plasma generator 15E generates the hydrogen plasma P in the form of a spark on the surfaces of the grinding media MD during the rotation of the ball mill container 2. The sixth plasma generator 15E thus causes the borate W to be exposed to the hydrogen plasma P during the rotation of the ball mill container 2.

The producing device 1 can employ any one of the above-described first plasma generator 15 to sixth plasma generator 15E.

The producing device 1 includes a controller 100 (FIG. 2) that collectively controls the above-described device components. The controller 100 is, for example, a computer including a processor, a storage, an input unit, a display, and the like. A computer program for performing the method MT and a variety of data used in performing the method MT are stored in a readable state in the storage of the controller 100. The controller 100 operates in accordance with a program based on an inputted recipe and sends a control signal. The components of the producing device 1 are each controlled by the control signal from the controller 100. The steps of the method MT may be performed by causing the components of the producing device 1 to operate in accordance with the control by the controller 100.

The contents of the present disclosure are not limited to the above-described embodiment but a variety of modification aspects can be implemented.

EXAMPLES

The present disclosure is described below in further detail with reference to Examples but the present disclosure is not limited to these Examples.

Example 1

A tetrahydroborate was produced by using the producing devices 1 shown in FIG. 1 to FIG. 5. $NaBO_2 \cdot 4H_2O$ (sodium metaborate tetrahydrate: manufactured by Kishida Chemical Co., Ltd., content 98 mass %) was prepared as a borate. It was heated at 160° C. for 15 minutes while being ground with a ball mill to remove crystallization water, thereby obtaining granular $NaBO_2$ (anhydrous sodium metaborate). The mean particle diameter of the granular $NaBO_2$ was 100 μm. The mean particle diameter was measured with a digital microscope.

Next, on the assumption of generation of 40 kg of $NaBH_4$, predetermined amounts of $NaBO_2$ and grinding media (chrome steel ball with a mean diameter of 30 mm) were put in the ball mill container 2 and the inside of the ball mill container 2 was vacuumed. The air (oxygen) inside the ball mill container 2 was thus discharged and then hydrogen was injected.

The motor 7 was turned on to start the rotation of the ball mill container 2. During the rotation of the ball mill container 2, the inside of the ball mill container 2 was heated to 300° C. while circulation flow injection of hydrogen was performed in such a way that the pressure inside the ball mill container 2 reaches atmospheric pressure. The atmosphere inside the ball mill container 2 taken by the circulation flow was processed through the cooling capacitor to be separated into moisture and hydrogen and then the hydrogen was reinjected into the ball mill container 2. The rotation of the ball mill container 2 was continued until the time product E(kJ·s/kg) of a grinding energy per unit weight of the target substance reached a predetermined value.

Immediately after the motor 7 was turned on to start the rotation of the ball mill container 2, a low-frequency voltage of 10 kHz, 5 kV was applied to between the pair of electrodes 17 provided on the inner wall of the ball mill container 2. According to the principle of the generation of dielectric-barrier discharge, a hydrogen plasma was generated near the surface of the dielectric member 16. The generation of the hydrogen plasma continued while the rotation of the ball mill container 2 was continued.

Subsequently, the plasma generation and the rotation were stopped and the processed target substance was taken out. Sodium tetrahydroborate and the grinding media were separated from the target substance, thereby obtaining desired sodium tetrahydroborate. It should be noted that the following Table 1 shows the details of the above-described experimental conditions.

TABLE 1

| Material | NaBO$_2$ | 70(kg) | | |
|---|---|---|---|---|
| | Hydrogen gas | 60000(L) | | |
| Grinding media | Total weight of grinding media | 350(kg) | | 120(kg) |
| | Speed of grinding media | | 6(m/s) | |
| | Processing time | 2400(s) | 1200(s) | 2000(s) |
| | Time product of grinding energy | 216(kJ · s/kg) | 108(kJ · s/kg) | 61.7(kJ · s/kg) |
| Plasma generation power source | Applied voltage | | 5(kV) | |
| | Frequency | | 10(kHz) | |
| | Hydrogenation rate | 96(%) | 85(%) | 67(%) |

In the table, the hydrogenation rate (inversion rate) was calculated as follows. First, sodium tetrahydroborate contained in the processed target substance was hydrolyzed and the thus-generated hydrogen was quantified. After the volume of the generated gas was measured, a hydrogen content was calculated from a hydrogen concentration determined by measuring the gas 200-fold diluted with air using a hydrogen detector tube (manufactured by KOMYO RIKAGAKU KOGYO K.K., measurable concentration range 0.05 to 0.8%). Then, the hydrogenation rate was calculated from the hydrogen content quantified as described above with reference to a hydrogen content resulting from 100% inversion.

(Evaluation 1)

The infrared absorption spectra of four types of samples different in processing time were measured by using Fourier transform infrared spectrophotometer FT/IR-6300 (manufactured by JASCO Corporation, product name). As a result of the measurement, the peak of a B—O bond derived from anhydrous sodium metaborate decreased and the peak of a B—H bond derived from sodium tetrahydroborate increased. Therefore, it has been confirmed that sodium tetrahydroborate is obtained by the plasma process on anhydrous sodium metaborate.

Further, regarding the sample having been subjected to the plasma process, a crystal structure was analyzed by XRD. Sodium tetrahydroborate having a composition of Na$_{0.6}$B$_{0.9}$H$_{4.0}$ was contained in the obtained sample.

Example 2

A tetrahydroborate was produced by using the producing devices 1 shown in FIG. 1, FIG. 2, FIG. 3, FIG. 6, and FIG. 7. NaBO$_2$·4H$_2$O (sodium metaborate tetrahydrate: manufactured by Kishida Chemical Co., Ltd., content 98 mass %) was prepared as a borate. It was heated at 160° C. for 15 minutes while being ground with a ball mill to remove crystallization water, thereby obtaining granular NaBO$_2$ (anhydrous sodium metaborate). The mean particle diameter of the granular NaBO$_2$ was 100 μm. The mean particle diameter was measured with a digital microscope.

Next, on the assumption of generation of 40 kg of NaBH$_4$, predetermined amounts of NaBO$_2$ and grinding media (chrome steel ball with a mean diameter of 30 mm) were put in the ball mill container 2 and the inside of the ball mill container 2 was vacuumed. The air (oxygen) inside the ball mill container 2 was thus discharged and then hydrogen was injected.

The motor 7 was turned on to start the rotation of the ball mill container 2. During the rotation of the ball mill container 2, the inside of the ball mill container 2 was heated to 300° C. while circulation flow injection of hydrogen was performed in such a way that the pressure inside the ball mill container 2 reaches atmospheric pressure. The atmosphere inside the ball mill container 2 taken by the circulation flow was processed through the cooling capacitor to be separated into moisture and hydrogen and then the hydrogen was reinjected into the ball mill container 2. The rotation of the ball mill container 2 was continued until the time product E(kJ·s/kg) of a grinding energy per unit weight of the target substance reached a predetermined value.

Immediately after the motor 7 was turned on to start the rotation of the ball mill container 2, a low frequency voltage of 10 kHz, 10 kV was applied to between electrodes provided in the plasma jet nozzle 21. A hydrogen plasma was generated and ejected from the plasma jet nozzle 21 according to the principle of the generation of a low-frequency plasma jet. The generation and ejection of the hydrogen plasma continued while the rotation of the ball mill container 2 was continued.

Subsequently, the plasma generation and the rotation were stopped and the processed target substance was taken out. Sodium tetrahydroborate and the grinding media were separated from the target substance, thereby obtaining desired sodium tetrahydroborate. It should be noted that the following Table 2 shows the details of the above-described experimental conditions.

TABLE 2

| Material | NaBO$_2$ | 70(kg) | | |
|---|---|---|---|---|
| | Hydrogen gas | 60000(L) | | |
| Grinding media | Total weight of grinding media | 350(kg) | | 120(kg) |
| | Speed of grinding media | | 6(m/s) | |
| | Processing time | 2400(s) | 1200(s) | 2000(s) |
| | Time product of grinding energy | 216(kJ · s/kg) | 108(kJ · s/kg) | 61.7(kJ · s/kg) |

TABLE 2-continued

| | | | | |
|---|---|---|---|---|
| Plasma generation power source | Applied voltage | 10(kV) | | |
| | Frequency | 10(kHz) | | |
| | Hydrogenation rate | 93(%) | 80(%) | 62(%) |

In the table, the hydrogenation rate (inversion rate) was calculated as follows. First, sodium tetrahydroborate contained in the processed target substance was hydrolyzed and the thus-generated hydrogen was quantified. After the volume of the generated gas was measured, a hydrogen content was calculated from a hydrogen concentration determined by measuring the gas 200-fold diluted with air using a hydrogen detector tube (manufactured by KOMYO RIKAGAKU KOGYO K.K., measurable concentration range 0.05 to 0.8%). Then, the hydrogenation rate was calculated from the hydrogen content quantified as described above with reference to a hydrogen content resulting from 100% inversion.

(Evaluation 2)

The infrared absorption spectra of four types of samples different in processing time were measured by using Fourier transform infrared spectrophotometer FT/IR-6300 (manufactured by JASCO Corporation, product name). As a result of the measurement, the peak of a B—O bond derived from anhydrous sodium metaborate decreased and the peak of a B—H bond derived from sodium tetrahydroborate increased. Therefore, it has been confirmed that sodium tetrahydroborate is obtained by the plasma process on anhydrous sodium metaborate.

Further, regarding the sample having been subjected to the plasma process, a crystal structure was analyzed by XRD. Sodium tetrahydroborate having a composition of $Na_{0.6}B_{0.9}H_{4.0}$ was contained in the obtained sample.

Example 3

A tetrahydroborate was produced by using the producing devices 1 shown in FIG. 1, FIG. 2, FIG. 3, FIG. 8, and FIG. 9. $NaBO_2·4H_2O$ (sodium metaborate tetrahydrate: manufactured by Kishida Chemical Co., Ltd., content 98 mass %) was prepared as a borate. It was heated at 160° C. for 15 minutes while being ground with a ball mill to remove crystallization water, thereby obtaining granular $NaBO_2$ (anhydrous sodium metaborate). The mean particle diameter of the granular $NaBO_2$ was 100 μm. The mean particle diameter was measured with a digital microscope.

Next, on the assumption of generation of 40 kg of $NaBH_4$, predetermined amounts of $NaBO_2$ and grinding media (chrome steel ball with a mean diameter of 30 mm) were put in the ball mill container 2 and the inside of the ball mill container 2 was vacuumed. The air (oxygen) inside the ball mill container 2 was thus discharged and then hydrogen was injected.

The motor 7 was turned on to start the rotation of the ball mill container 2. During the rotation of the ball mill container 2, the inside of the ball mill container 2 was heated to 300° C. while circulation flow injection of hydrogen was performed in such a way that the pressure inside the ball mill container 2 reaches atmospheric pressure. The atmosphere inside the ball mill container 2 taken by the circulation flow was processed through the cooling capacitor to be separated into moisture and hydrogen and then the hydrogen was reinjected into the ball mill container 2. The rotation of the ball mill container 2 was continued until the time product E(kJ·s/kg) of a grinding energy per unit weight of the target substance reached a predetermined value.

Immediately after the motor 7 was turned on to start the rotation of the ball mill container 2, a pulse voltage of 5V was applied to between the pair of electrodes 17B provided on the inner wall of the ball mill container 2, the pulse voltage turning on/off a direct-current voltage with a 3.3-ins pulsation resulting from full-wave rectification of a three-phase alternating current at a ratio of energization for 8 ins and de-energization for 2 ins. A high-temperature hydrogen plasma in the form of a spark was generated between the grinding media when the grinding media (chrome steel ball with a mean diameter of 30 mm) flowing inside the reaction container collide or at a collision spot when the inner wall of the reaction container and the grinding media collide. The generation of the hydrogen plasma continued while the rotation of the ball mill container 2 was continued.

Subsequently, the plasma generation and the rotation were stopped and the processed target substance was taken out. Sodium tetrahydroborate and the grinding media were separated from the target substance, thereby obtaining desired sodium tetrahydroborate. It should be noted that the following Table 3 shows the details of the above-described experimental conditions.

TABLE 3

| | | | | |
|---|---|---|---|---|
| Material | $NaBO_2$ | 70(kg) | | |
| | Hydrogen gas | 60000(L) | | |
| Grinding media | Total weight of grinding media | 350(kg) | | 120(kg) |
| | Speed of grinding media | 6(m/s) | | |
| | Processing time | 1800(s) | 1200(s) | 2000(s) |
| | Time product of grinding energy | 162(kJ · s/kg) | 108(kJ · s/kg) | 61.7(kJ · s/kg) |
| Plasma generation power source | Applied voltage | 5(V) | | |
| | ON/OFF ratio | 8(ms):2(ms) | | |
| | Voltage pulsation frequency | 360(Hz) | | |
| | Hydrogenation rate | 94(%) | 90(%) | 75(%) |

In the table, the hydrogenation rate (inversion rate) was calculated as follows. First, sodium tetrahydroborate contained in the processed target substance was hydrolyzed and the thus-generated hydrogen was quantified. After the volume of the generated gas was measured, a hydrogen content was calculated from a hydrogen concentration determined by measuring the gas 200-fold diluted with air using a hydrogen detector tube (manufactured by KOMYO RIKAGAKU KOGYO K.K., measurable concentration range 0.05 to 0.8%). Then, the hydrogenation rate was calculated from the hydrogen content quantified as described above with reference to a hydrogen content resulting from 100% inversion.

(Evaluation 3)

The infrared absorption spectra of four types of samples different in processing time were measured by using Fourier transform infrared spectrophotometer FT/IR-6300 (manufactured by JASCO Corporation, product name). As a result of the measurement, the peak of a B—O bond derived from anhydrous sodium metaborate decreased and the peak of a B—H bond derived from sodium tetrahydroborate increased. Therefore, it has been confirmed that sodium tetrahydroborate is obtained by the plasma process on anhydrous sodium metaborate.

Further, regarding the sample having been subjected to the plasma process, a crystal structure was analyzed by XRD. Sodium tetrahydroborate having a composition of $Na_{0.6}B_{0.9}H_{4.0}$ was contained in the obtained sample.

Example 4

A tetrahydroborate was produced by using the producing devices 1 shown in FIG. 1, FIG. 2, FIG. 3, FIG. 10, and FIG. 11. $NaBO_2 \cdot 4H_2O$ (sodium metaborate tetrahydrate: manufactured by Kishida Chemical Co., Ltd., content 98 mass %) was prepared as a borate. It was heated at 160° C. for 15 minutes while being ground with a ball mill to remove crystallization water, thereby obtaining granular $NaBO_2$ (anhydrous sodium metaborate). The mean particle diameter of the granular $NaBO_2$ was 100 μm. The mean particle diameter was measured with a digital microscope.

Next, on the assumption of generation of 40 kg of $NaBH_4$, predetermined amounts of $NaBO_2$ and grinding media (chrome steel ball with a mean diameter of 30 mm) were put in the ball mill container 2 and the inside of the ball mill container 2 was vacuumed. The air (oxygen) inside the ball mill container 2 was thus discharged and then hydrogen was injected.

The motor 7 was turned on to start the rotation of the ball mill container 2. During the rotation of the ball mill container 2, the inside of the ball mill container 2 was heated to 300° C. while circulation flow injection of hydrogen was performed in such a way that the pressure inside the ball mill container 2 reaches atmospheric pressure. The atmosphere inside the ball mill container 2 taken by the circulation flow was processed through the cooling capacitor to be separated into moisture and hydrogen and then the hydrogen was reinjected into the ball mill container 2. The rotation of the ball mill container 2 was continued until the time product E(kJ·s/kg) of a grinding energy per unit weight of the target substance reached a predetermined value.

Immediately after the motor 7 was turned on to start the rotation of the ball mill container 2, a pulse voltage of 5V was applied to between the pair of electrodes 17C provided on the inner wall of the ball mill container 2, the pulse voltage turning on/off a direct-current voltage with a 3.3-ins pulsation resulting from full-wave rectification of a three-phase alternating current at a ratio of energization for 8 ins and de-energization for 2 ins. A high-temperature hydrogen plasma in the form of a spark was generated between the grinding media when the grinding media (chrome steel ball with a mean diameter of 30 mm) flowing inside the reaction container collide or at a collision spot when the inner wall of the reaction container and the grinding media collide. The generation of the hydrogen plasma continued while the rotation of the ball mill container 2 was continued.

Subsequently, the plasma generation and the rotation were stopped and the processed target substance was taken out. Sodium tetrahydroborate and the grinding media were separated from the target substance, thereby obtaining desired sodium tetrahydroborate. It should be noted that the following Table 4 shows the details of the above-described experimental conditions.

TABLE 4

| Material | $NaBO_2$ | | 70(kg) | |
| --- | --- | --- | --- | --- |
| | Hydrogen gas | | 60000(L) | |
| Grinding media | Total weight of grinding media | 350(kg) | | 120(kg) |
| | Speed of grinding media | | 6(m/s) | |
| | Processing time | 1800(s) | 1200(s) | 2000(s) |
| Time product of grinding energy | | 162(kJ·s/kg) | 108(kJ·s/kg) | 61.7(kJ·s/kg) |
| Plasma generation power source | Applied voltage | | 5(V) | |
| | ON/OFF ratio | | 8(ms):2(ms) | |
| | Voltage pulsation frequency | | 360(Hz) | |
| Hydrogenation rate | | 93(%) | 89(%) | 74(%) |

In the table, the hydrogenation rate (inversion rate) was calculated as follows. First, sodium tetrahydroborate contained in the processed target substance was hydrolyzed and the thus-generated hydrogen was quantified. After the volume of the generated gas was measured, a hydrogen content was calculated from a hydrogen concentration determined by measuring the gas 200-fold diluted with air using a hydrogen detector tube (manufactured by KOMYO RIKAGAKU KOGYO K.K., measurable concentration range 0.05 to 0.8%). Then, the hydrogenation rate was calculated from the hydrogen content quantified as described above with reference to a hydrogen content resulting from 100% inversion.

(Evaluation 4)

The infrared absorption spectra of four types of samples different in processing time were measured by using Fourier transform infrared spectrophotometer FT/IR-6300 (manufactured by JASCO Corporation, product name). As a result of the measurement, the peak of a B—O bond derived from anhydrous sodium metaborate decreased and the peak of a B—H bond derived from sodium tetrahydroborate increased. Therefore, it has been confirmed that sodium tetrahydroborate is obtained by the plasma process on anhydrous sodium metaborate.

Further, regarding the sample having been subjected to the plasma process, a crystal structure was analyzed by XRD. Sodium tetrahydroborate having a composition of $Na_{0.6}B_{0.9}H_{4.0}$ was contained in the obtained sample.

Example 5

A tetrahydroborate was produced by using the producing devices 1 shown in FIG. 1, FIG. 2, FIG. 3, FIG. 12, and FIG. 13. $NaBO_2 \cdot 4H_2O$ (sodium metaborate tetrahydrate: manufactured by Kishida Chemical Co., Ltd., content 98 mass %) was prepared as a borate. It was heated at 160° C. for 15 minutes while being ground with a ball mill to remove crystallization water, thereby obtaining granular $NaBO_2$ (anhydrous sodium metaborate). The mean particle diameter of the granular $NaBO_2$ was 100 μm. The mean particle diameter was measured with a digital microscope.

Next, on the assumption of generation of 40 kg of $NaBH_4$, predetermined amounts of $NaBO_2$ and grinding media (chrome steel ball with a mean diameter of 30 mm) were put in the ball mill container 2 and the inside of the ball mill container 2 was vacuumed. The air (oxygen) inside the ball mill container 2 was thus discharged and then hydrogen was injected.

The motor 7 was turned on to start the rotation of the ball mill container 2. During the rotation of the ball mill container 2, the inside of the ball mill container 2 was heated to 300° C. while circulation flow injection of hydrogen was performed in such a way that the pressure inside the ball mill container 2 reaches atmospheric pressure. The atmosphere inside the ball mill container 2 taken by the circulation flow was processed through the cooling capacitor to be separated into moisture and hydrogen and then the hydrogen was reinjected into the ball mill container 2. The rotation of the ball mill container 2 was continued until the time product E(kJ·s/kg) of a grinding energy per unit weight of the target substance reached a predetermined value.

Immediately after the motor 7 was turned on to start the rotation of the ball mill container 2, a pulse voltage of 5V was applied to between the pair of electrodes 17D provided on the inner wall of the ball mill container 2, the pulse voltage turning on/off a direct-current voltage with a 3.3-ins pulsation resulting from full-wave rectification of a three-phase alternating current at a ratio of energization for 8 ins and de-energization for 2 ins. A high-temperature hydrogen plasma in the form of a spark was generated between the grinding media when the grinding media (chrome steel ball with a mean diameter of 30 mm) flowing inside the reaction container collide or at a collision spot when the inner wall of the reaction container and the grinding media collide. The generation of the hydrogen plasma continued while the rotation of the ball mill container 2 was continued.

Subsequently, the plasma generation and the rotation were stopped and the processed target substance was taken out. Sodium tetrahydroborate and the grinding media were separated from the target substance, thereby obtaining desired sodium tetrahydroborate. It should be noted that the following Table 5 shows the details of the above-described experimental conditions.

TABLE 5

| Material | $NaBO_2$ | 70(kg) | | |
|---|---|---|---|---|
| | Hydrogen gas | 60000(L) | | |
| Grinding media | Total weight of grinding media | 350(kg) | | 120(kg) |
| | Speed of grinding media | | 6(m/s) | |
| | Processing time | 1800(s) | 1200(s) | 2000(s) |
| | Time product of grinding energy | 162(kJ · s/kg) | 108(kJ · s/kg) | 61.7(kJ · s/kg) |
| Plasma generation power source | Applied voltage | | 5(V) | |
| | ON/OFF ratio | | 8(ms):2(ms) | |
| | Voltage pulsation frequency | | 360(Hz) | |
| | Hydrogenation rate | 95(%) | 91(%) | 76(%) |

In the table, the hydrogenation rate (inversion rate) was calculated as follows. First, sodium tetrahydroborate contained in the processed target substance was hydrolyzed and the thus-generated hydrogen was quantified. After the volume of the generated gas was measured, a hydrogen content was calculated from a hydrogen concentration determined by measuring the gas 200-fold diluted with air using a hydrogen detector tube (manufactured by KOMYO RIKAGAKU KOGYO K.K., measurable concentration range 0.05 to 0.8%). Then, the hydrogenation rate was calculated from the hydrogen content quantified as described above with reference to a hydrogen content resulting from 100% inversion.

(Evaluation 5)

The infrared absorption spectra of four types of samples different in processing time were measured by using Fourier transform infrared spectrophotometer FT/IR-6300 (manufactured by JASCO Corporation, product name). As a result of the measurement, the peak of a B—O bond derived from anhydrous sodium metaborate decreased and the peak of a B—H bond derived from sodium tetrahydroborate increased. Therefore, it has been confirmed that sodium tetrahydroborate is obtained by the plasma process on anhydrous sodium metaborate.

Further, regarding the sample having been subjected to the plasma process, a crystal structure was analyzed by XRD. Sodium tetrahydroborate having a composition of $Na_{0.6}B_{0.9}H_{4.0}$ was contained in the obtained sample.

Example 6

A tetrahydroborate was produced by using the producing devices 1 shown in FIG. 1, FIG. 2, FIG. 3, FIG. 14, and FIG. 15. $NaBO_2·4H_2O$ (sodium metaborate tetrahydrate: manufactured by Kishida Chemical Co., Ltd., content 98 mass %) was prepared as a borate. It was heated at 160° C. for 15 minutes while being ground with a ball mill to remove crystallization water, thereby obtaining granular $NaBO_2$ (anhydrous sodium metaborate). The mean particle diameter of the granular $NaBO_2$ was 100 μm. The mean particle diameter was measured with a digital microscope.

Next, on the assumption of generation of 40 kg of $NaBH_4$, predetermined amounts of $NaBO_2$ and grinding media (chrome steel ball with a mean diameter of 30 mm) were put in the ball mill container 2 and the inside of the ball mill container 2 was vacuumed. The air (oxygen) inside the ball mill container 2 was thus discharged and then hydrogen was injected.

The motor 7 was turned on to start the rotation of the ball mill container 2. During the rotation of the ball mill container 2, the inside of the ball mill container 2 was heated to 300° C. while circulation flow injection of hydrogen was performed in such a way that the pressure inside the ball mill container 2 reaches atmospheric pressure. The atmosphere inside the ball mill container 2 taken by the circulation flow was processed through the cooling capacitor to be separated into moisture and hydrogen and then the hydrogen was reinjected into the ball mill container 2. The rotation of the ball mill container 2 was continued until the time product E(kJ·s/kg) of a grinding energy per unit weight of the target substance reached a predetermined value.

Immediately after the motor 7 was turned on to start the rotation of the ball mill container 2, a pulse voltage of 5V was applied to between the pair of electrodes 17E provided on the inner wall of the ball mill container 2, the pulse voltage turning on/off a direct-current voltage with a 3.3-ins pulsation resulting from full-wave rectification of a three-phase alternating current at a ratio of energization for 8 ins and de-energization for 2 ins. A high-temperature hydrogen plasma in the form of a spark was generated between the grinding media when the grinding media (chrome steel ball with a mean diameter of 30 mm) flowing inside the reaction container collide or at a collision spot when the inner wall of the reaction container and the grinding media collide. The generation of the hydrogen plasma continued while the rotation of the ball mill container 2 was continued.

Subsequently, the plasma generation and the rotation were stopped and the processed target substance was taken out. Sodium tetrahydroborate and the grinding media were separated from the target substance, thereby obtaining desired sodium tetrahydroborate. It should be noted that the following Table 6 shows the details of the above-described experimental conditions.

TABLE 6

| Material | $NaBO_2$ | | 70(kg) | |
|---|---|---|---|---|
| | Hydrogen gas | | 60000(L) | |
| Grinding media | Total weight of grinding media | 350(kg) | | 120(kg) |
| | Speed of grinding media | | 6(m/s) | |
| | Processing time | 1800(s) | 1200(s) | 2000(s) |
| | Time product of grinding energy | 162(kJ · s/kg) | 108(kJ · s/kg) | 61.7(kJ · s/kg) |
| Plasma generation power source | Applied voltage | | 5(V) | |
| | ON/OFF ratio | | 8(ms):2(ms) | |
| | Voltage pulsation frequency | | 360(Hz) | |
| | Hydrogenation rate | 96(%) | 92(%) | 78(%) |

In the table, the hydrogenation rate (inversion rate) was calculated as follows. First, sodium tetrahydroborate contained in the processed target substance was hydrolyzed and the thus-generated hydrogen was quantified. After the volume of the generated gas was measured, a hydrogen content was calculated from a hydrogen concentration determined by measuring the gas 200-fold diluted with air using a hydrogen detector tube (manufactured by KOMYO RIKAGAKU KOGYO K.K., measurable concentration range 0.05 to 0.8%). Then, the hydrogenation rate was calculated from the hydrogen content quantified as described above with reference to a hydrogen content resulting from 100% inversion.

(Evaluation 6)

The infrared absorption spectra of four types of samples different in processing time were measured by using Fourier transform infrared spectrophotometer FT/IR-6300 (manufactured by JASCO Corporation, product name). As a result of the measurement, the peak of a B—O bond derived from anhydrous sodium metaborate decreased and the peak of a B—H bond derived from sodium tetrahydroborate increased. Therefore, it has been confirmed that sodium tetrahydroborate is obtained by the plasma process on anhydrous sodium metaborate.

Further, regarding the sample having been subjected to the plasma process, a crystal structure was analyzed by XRD. Sodium tetrahydroborate having a composition of $Na_{0.6}B_{0.9}H_{4.0}$ was contained in the obtained sample.

In the above Examples 1 to 6, it has been confirmed that sodium tetrahydroborate is obtained by using the method MT and the producing device 1 according to the present disclosure.

REFERENCE SIGNS LIST

1 . . . device for producing, 2 . . . ball mill container, 2d . . . processing chamber, 6 . . . drive, 11a . . . gas supplying unit, 14 . . . power source, 15 . . . first plasma generator, 15A . . . second plasma generator, 15B . . . third plasma generator, 15C . . . fourth plasma generator, 15D . . . fifth plasma generator, 15E . . . sixth plasma generator, 16 . . . dielectric member, 17, 17B, 17C, 17D, 17E . . . a pair of electrodes, 18, 18B, 18C, 18D, 18E . . . insulating body, 21 . . . plasma jet nozzle.

The invention claimed is:

1. A method for producing a tetrahydroborate, the method comprising a hydrogenating step of exposing a borate to a hydrogen plasma while grinding the borate, wherein the hydrogen plasma is a plasma generated by dielectric-barrier discharge.

2. The method for producing a tetrahydroborate according to claim 1, wherein the hydrogen plasma is generated by using a source gas containing at least one of a hydrogen gas and a hydrocarbon gas.

3. The method for producing a tetrahydroborate according to claim 1, wherein the hydrogen plasma is a high-temperature plasma.

4. The method for producing a tetrahydroborate according to claim 1, wherein the borate is exposed to the hydrogen plasma while being heated and ground in the hydrogenating step.

5. The method for producing a tetrahydroborate according to claim 1, wherein a reductant bondable to hydrogen is simultaneously processed with the borate in the hydrogenating step.

6. The method for producing a tetrahydroborate according to claim 1, wherein the borate is sodium metaborate.

7. The method for producing a tetrahydroborate according to claim 1, further comprising, prior to the hydrogenating step, a preheating step of heating the borate.

8. The method for producing a tetrahydroborate according to claim 1, further comprising, prior to the hydrogenating step, a borate preparing step of reacting a tetrahydroborate with water to obtain the borate.

9. The method for producing a tetrahydroborate according to claim 7, further comprising, prior to the preheating step, a borate preparing step of reacting a tetrahydroborate with water to obtain the borate.

10. The method for producing a tetrahydroborate according to claim 2, wherein the hydrogen plasma is a high-temperature plasma.

11. The method for producing a tetrahydroborate according to claim 2, wherein the borate is exposed to the hydrogen plasma while being heated and ground in the hydrogenating step.

12. The method for producing a tetrahydroborate according to claim 2, wherein a reductant bondable to hydrogen is simultaneously processed with the borate in the hydrogenating step.

13. A method for producing a tetrahydroborate, the method comprising a hydrogenating step of exposing a borate to a hydrogen plasma while grinding the borate, wherein the hydrogen plasma is provided to the borate as a plasma jet.

14. The method for producing a tetrahydroborate according to claim 13, wherein the hydrogen plasma is generated by using a source gas containing at least one of a hydrogen gas and a hydrocarbon gas.

15. The method for producing a tetrahydroborate according to claim 13, wherein the hydrogen plasma is a high-temperature plasma.

16. The method for producing a tetrahydroborate according to claim 13, wherein the borate is exposed to the hydrogen plasma while being heated and ground in the hydrogenating step.

* * * * *